US009322874B2

(12) United States Patent
Arnold et al.

(10) Patent No.: US 9,322,874 B2

(45) Date of Patent: Apr. 26, 2016

(54) INTERPOSER BETWEEN A TESTER AND MATERIAL HANDLING EQUIPMENT TO SEPARATE AND CONTROL DIFFERENT REQUESTS OF MULTIPLE ENTITIES IN A TEST CELL OPERATION

(75) Inventors: Henry Arnold, Yorba Linda, CA (US); Pierre Gauthier, Quebec (CA); Brian Buras, Austin, TX (US); James Stephen Ledford, Birmingham, AL (US)

(73) Assignee: ADVANTEST CORPORATION, Tokyo (JP)

( * ) Notice: Subject to any disclaimer, the term of this patent is extended or adjusted under 35 U.S.C. 154(b) by 811 days.

(21) Appl. No.: 13/444,703

(22) Filed: Apr. 11, 2012

(65) Prior Publication Data

US 2013/0275072 A1 Oct. 17, 2013

(51) Int. Cl.
*G06F 19/00* (2011.01)
*G01R 31/28* (2006.01)

(52) U.S. Cl.
CPC .................................. *G01R 31/2889* (2013.01)

(58) Field of Classification Search
USPC .................... 702/47, 84, 108, 118; 379/93.31
See application file for complete search history.

(56) References Cited

U.S. PATENT DOCUMENTS

| | | | |
|---|---|---|---|
| 5,359,648 A * | 10/1994 | Dunn et al. | 379/93.31 |
| 7,254,806 B1 | 8/2007 | Yates, Jr. et al. | |
| 7,383,147 B2 * | 6/2008 | Dorough et al. | 702/118 |
| 8,442,067 B2 | 5/2013 | Bryan et al. | |
| 2002/0155628 A1 | 10/2002 | Bulaga et al. | |
| 2006/0047705 A1 | 3/2006 | Reade et al. | |
| 2006/0150018 A1 | 7/2006 | Cousin et al. | |
| 2006/0212253 A1 | 9/2006 | Velichko et al. | |
| 2007/0152695 A1 | 7/2007 | Bosy et al. | |
| 2007/0198445 A1 | 8/2007 | Zen | |
| 2008/0281566 A1 | 11/2008 | Wang et al. | |
| 2009/0193294 A1 | 7/2009 | Nakamura et al. | |
| 2010/0023294 A1 | 1/2010 | Fan et al. | |

FOREIGN PATENT DOCUMENTS

| | | |
|---|---|---|
| EP | 0397937 | 11/1990 |

OTHER PUBLICATIONS

"Braha et al., On the Use of Decision Tree Induction for Discovery of Interactions in a Photolithographic Process, IEEETransactions on Semiconductor Manufacturing, vol. 16, No. 4, pp. 644-652, Nov. 2003."

Irani et al., Applying Machine Learning to Semiconductor Manufacturing, IEEE Expert., vol. 8, Issue 1, Feb. 1993.

(Continued)

*Primary Examiner* — Lam Nguyen

(57) ABSTRACT

An apparatus for testing a device. The apparatus comprises a test control module and a test analysis module. The test control module is operable to generate and transmit first prober and handler (PH) requests to a supervisor module. The supervisor module is operable to transmit first PH commands to a prober and handler for execution thereof. The test analysis module is operable to generate and transmit second PH requests to the supervisor module. The supervisor module is further operable to transmit second PH commands to the prober and handler for execution thereof. The execution of the second PH commands are performed transparently to the test control module.

20 Claims, 17 Drawing Sheets

(56) References Cited

OTHER PUBLICATIONS

Guh et al., An Effective Application of Decision Tree Learning for On-line Detection of Mean Shifts in Multivariate Control Charts, Computers & Industrial Engineering, vol. 55, pp. 475-493, 2008.

Sun et al., Decision Tree and PCA-based Fault Diagnosis of Rotating Machinery, Mechanical Systems and Signal Processing, vol. 21, pp. 1300-1317,2007.

"Yang et al., VIBEX: An Expert System for Vibration Fault Diagnosis of Rotating Machinery Using Decision Tree and DecisionTable, Expert Systems with Applications, vol. 28, pp. 735-742, 2005".

"Kang et al., Virtual Metrology for Run-to-Run Control in Semiconductor Manufacturing, Expert Systems with Applications, vol. 38, pp. 2508-2522, Mar. 2011".

* cited by examiner

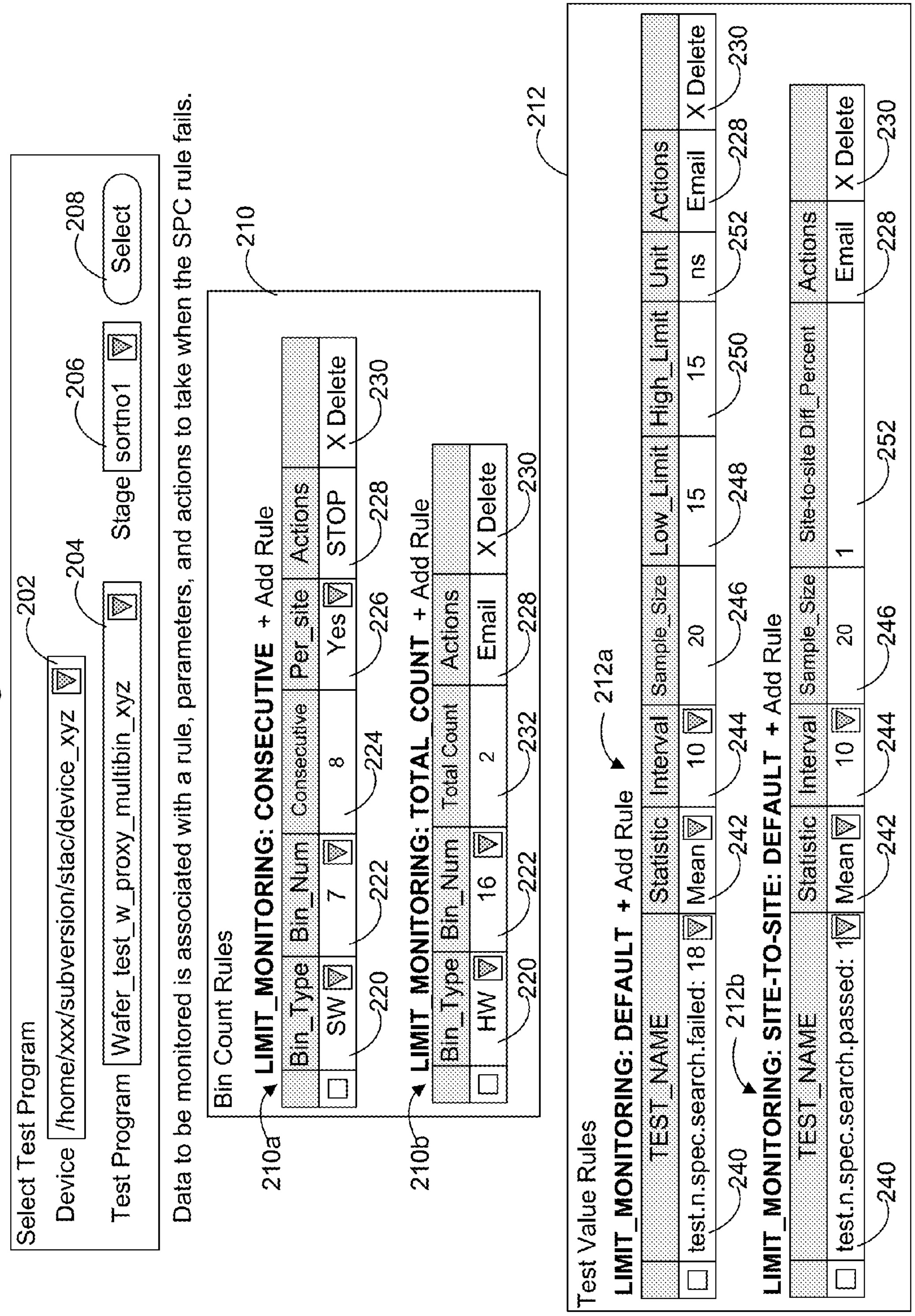
Figure 2
Select Test Program
Device /home/xxx/subversion/stac/device_xyz
202
Test Program Wafer_test_w_proxy_multibin_xyz
204
Stage sortno1
206
Select
208
Data to be monitored is associated with a rule, parameters, and actions to take when the SPC rule fails.
Bin Count Rules
210
LIMIT_MONITORING: CONSECUTIVE + Add Rule
210a
Bin_Type
Bin_Num
Consecutive
Per_site
Actions
SW
7
8
Yes
STOP
X Delete
220
222
224
226
228
230
LIMIT_MONITORING: TOTAL COUNT + Add Rule
210b
Bin_Type
Bin_Num
Total Count
Actions
HW
16
2
Email
X Delete
220
222
232
228
230
Test Value Rules
212
LIMIT_MONITORING: DEFAULT + Add Rule
212a
TEST_NAME
Statistic
Interval
Sample_Size
Low_Limit
High_Limit
Unit
Actions
test.n.spec.search.failed: 18
Mean
10
20
15
15
ns
Email
X Delete
240
242
244
246
248
250
252
228
230
LIMIT_MONITORING: SITE-TO-SITE: DEFAULT + Add Rule
212b
TEST_NAME
Statistic
Interval
Sample_Size
Site-to-site Diff_Percent
Actions
test.n.spec.search.passed: 1
Mean
10
20
1
Email
X Delete
240
242
244
246
252
228
230

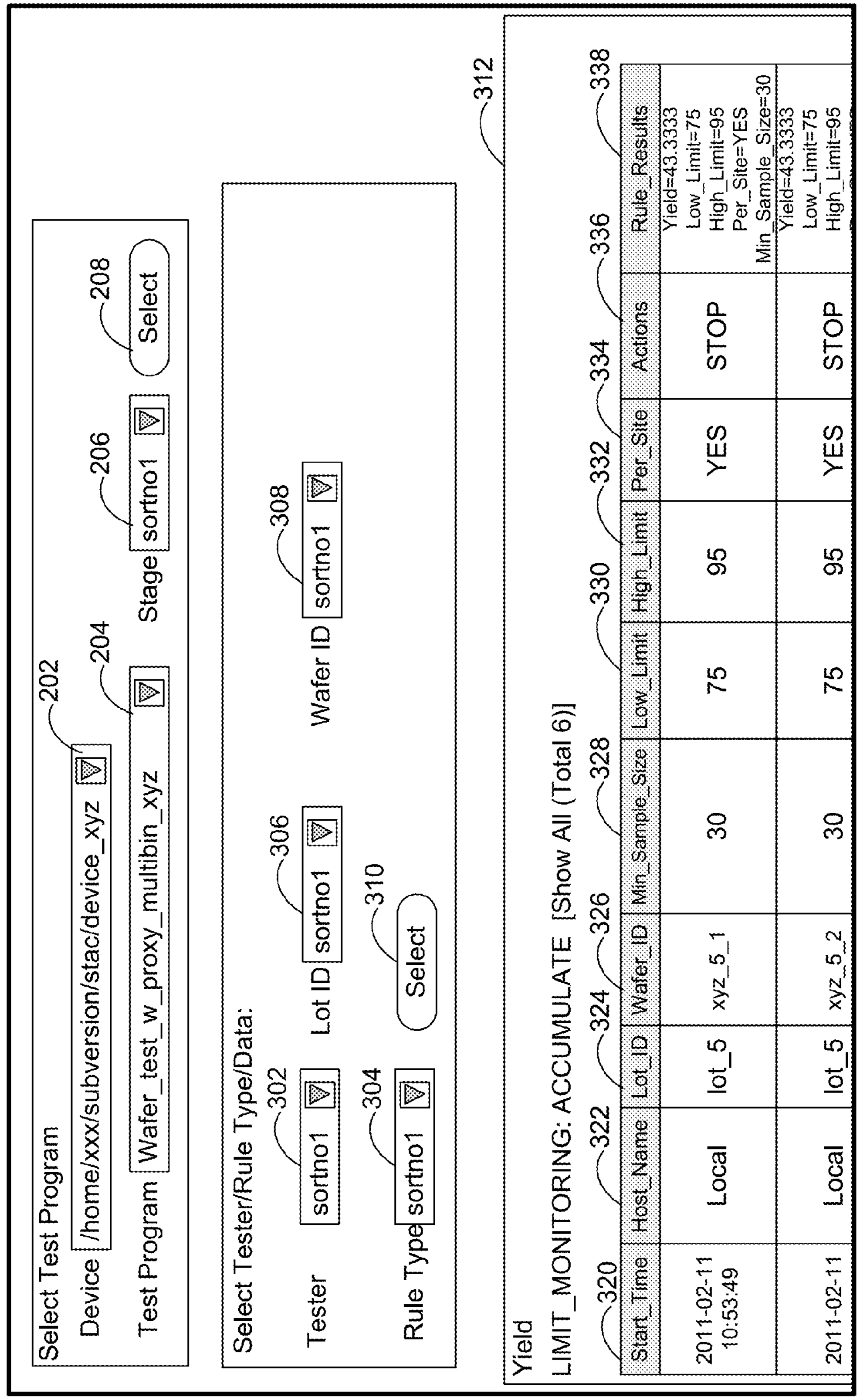
Figure 3
Select Test Program
Device /home/xxx/subversion/stac/device_xyz
Test Program Wafer_test_w_proxy_multibin_xyz
Stage sortno1
Select
202
204
206
208
Select Tester/Rule Type/Data:
Tester sortno1
Lot ID sortno1
Wafer ID sortno1
Rule Type sortno1
Select
302
304
306
308
310
312
Yield
LIMIT_MONITORING: ACCUMULATE [Show All (Total 6)]
Start_Time
Host_Name
Lot_ID
Wafer_ID
Min_Sample_Size
Low_Limit
High_Limit
Per_Site
Actions
Rule_Results
2011-02-11 10:53:49
Local
lot_5
xyz_5_1
30
75
95
YES
STOP
Yield=43.3333
Low_Limit=75
High_Limit=95
Per_Site=YES
Min_Sample_Size=30
2011-02-11
Local
lot_5
xyz_5_2
30
75
95
YES
STOP
Yield=43.3333
Low_Limit=75
High_Limit=95
320
322
324
326
328
330
332
334
336
338

400
Database Server
416
Lot Recipe Control
402
Event Monitor
404
State Machine
406
SPC Module
408
Other Actions (alarm, email, etc.)
418
Prober/Handler (PH) Supervisor
414
Test Program
103
Normal PH Calls
Custom Component
420
Measured Value Monitor (MVM)
412
Bin Control
410
Download Rules
Check Rules
Get Rules
Continue or execute action when rule fails
Ex. Check iddq mean
Ex. Bin count, yield Previous Device
Test start
Device Test
Index Time
MVM Capture
SBC Capture
PPC & SPC Rule
Prober Action
Test start
Device Test
Next Device
400-600ms
1302
1304
1306
1308
1310
1312

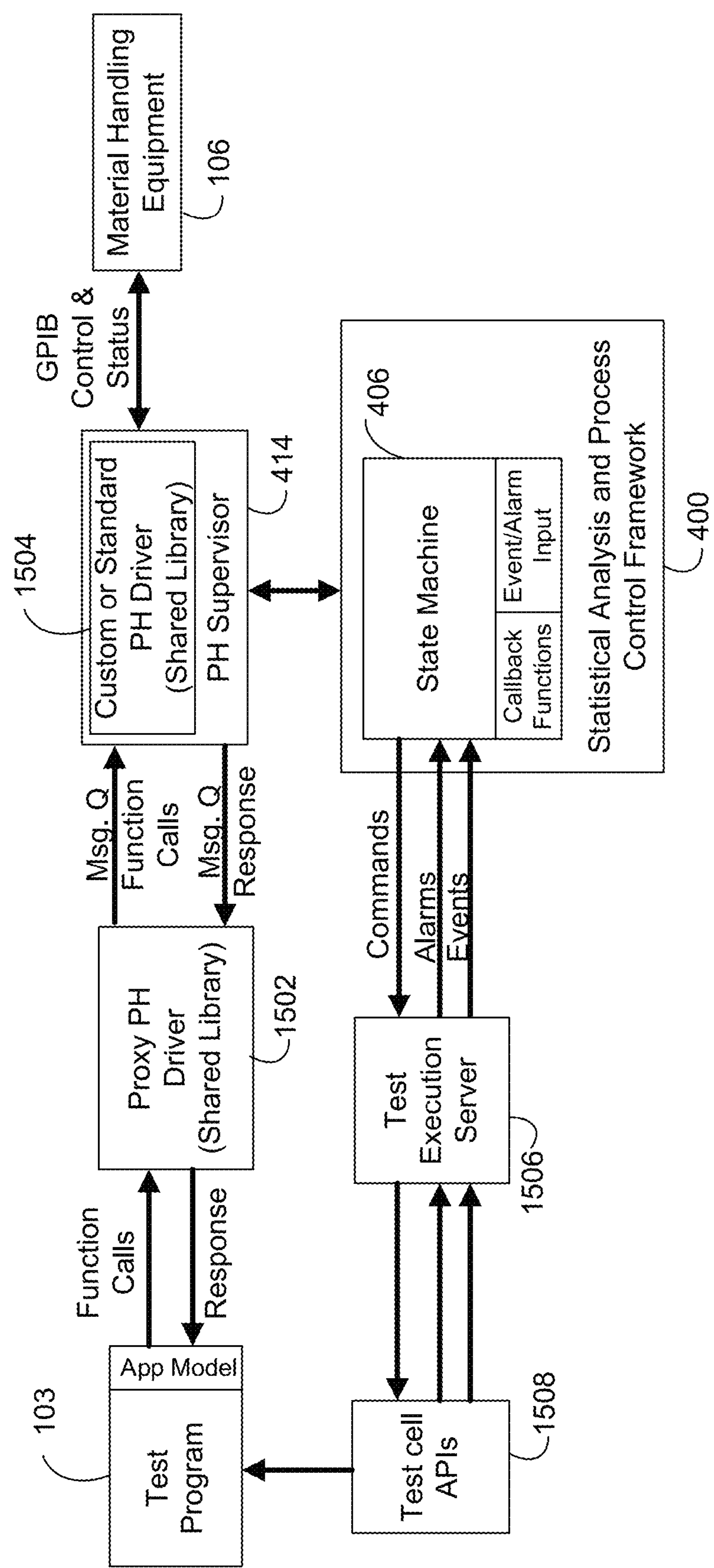
Figure 15
Material Handling Equipment
106
GPIB Control & Status
Custom or Standard PH Driver (Shared Library)
1504
PH Supervisor
414
406
State Machine
Event/Alarm Input
Callback Functions
Statistical Analysis and Process Control Framework
400
Msg. Q Function Calls
Msg. Q Response
Proxy PH Driver (Shared Library)
1502
Commands
Alarms
Events
Test Execution Server
1506
Function Calls
Response
App Model
Test Program
103
Test cell APIs
1508

INTERPOSER BETWEEN A TESTER AND MATERIAL HANDLING EQUIPMENT TO SEPARATE AND CONTROL DIFFERENT REQUESTS OF MULTIPLE ENTITIES IN A TEST CELL OPERATION

TECHNICAL FIELD

The present disclosure relates generally to the field of automated test equipment and more specifically to the field of statistical process control of automated test equipment.

BACKGROUND

Automated test equipment (ATE) can be any testing assembly that performs a test on a device, semiconductor wafer or die, etc. ATE assemblies may be used to execute automated tests that quickly perform measurements and generate test results that can then be analyzed. An ATE assembly may be anything from a computer system coupled to a meter, to a complicated automated test assembly that may include a custom, dedicated computer control system and many different test instruments that are capable of automatically testing electronics parts and/or semiconductor wafer testing, such as system-on-chip (SOC) testing or integrated circuit testing.

The test results that are provided from an ATE assembly may then be analyzed to evaluate electronic component being tested. Such test result evaluations may be a part of a statistical process control method. In one exemplary embodiment, statistical process control methods may be used to monitor and control a manufacturing process to ensure that the manufacturing process is producing the desired product at a desired level of efficiency and at a desired level of quality. In one exemplary embodiment, after a prescribed ATE test run has completed, the compiled test results are statistically analyzed using a statistical process control method. Changes to the manufacturing process and/or test process may also be implemented in follow-on production runs based upon the statistical analysis of the test results.

SUMMARY OF THE INVENTION

Embodiments of this present invention provide a solution to the challenges inherent in implementing statistical process control methods in automated testing. In particular, embodiments of this invention may be used to make execution decisions beyond pass/fail results by providing an opportunity to correct a process before many testing hours have been expended on wafers being tested either incorrectly, or on wafers that have an inherent problem. In one exemplary embodiment of the present invention, a method for real-time statistical analysis of test results is disclosed. In the method, after a determined quantity of requested test results have been collected, statistical analysis of the collected test results may be performed with selected actions performed in response to any identified testing errors or defective wafers. As described herein, the assessment process and actions may also be applied to wafer sort and final test statistics, as well as wafer tests.

In one exemplary embodiment, an apparatus for testing a device is disclosed. The apparatus comprises a test control module and a test analysis module. The test control module is operable to generate and transmit first prober and handler (PH) requests to a supervisor module. The supervisor module is operable to transmit first PH commands to a prober and handler for execution thereof. The test analysis module is operable to generate and transmit second PH requests to the supervisor module. The supervisor module is further operable to transmit second PH commands to the prober and handler for execution thereof. The execution of the second PH commands is performed transparently to the test control module.

In one exemplary embodiment, a method for testing a device is disclosed. The method comprises generating and transmitting first prober and handler (PH) commands to a prober and handler for execution. The first PH commands are generated in response to first PH requests from a test control module. The method further comprises generating and transmitting second PH commands to the prober and handler for execution. The second PH commands are generated in response to first PH requests from a test analysis module. The execution of the second PH commands is performed transparently to the test control module.

BRIEF DESCRIPTION OF THE DRAWINGS

The present invention will be better understood from a reading of the following detailed description, taken in conjunction with the accompanying drawing figures in which like reference characters designate like elements and in which:

FIG. 2 illustrates an exemplary graphical user interface for selecting, editing, and creating statistical process control rules;

FIG. 3 illustrates an exemplary graphical user interface for displaying test results of control rules;

FIG. 15 illustrates an exemplary prober/handler supervisor component and a proxy prober/handler driver connected with a statistical analysis and control architecture in accordance with an embodiment of the present invention;

DETAILED DESCRIPTION

Figure 1:
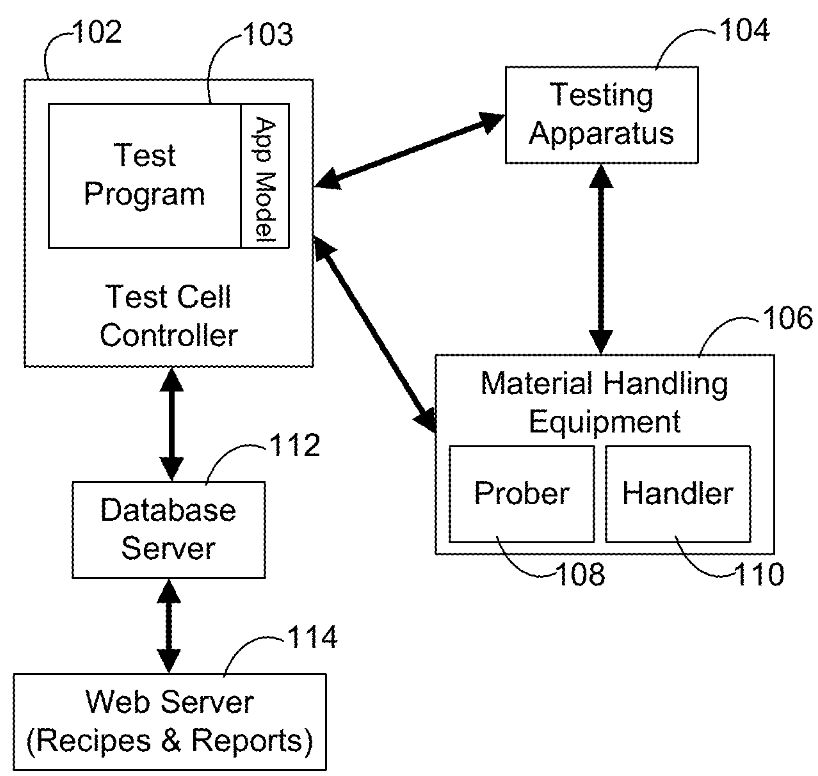
FIG. 1 illustrates an exemplary simplified block diagram of an automated test equipment (ATE) implementing statistical process controls.

Reference will now be made in detail to the preferred embodiments of the present invention, examples of which are illustrated in the accompanying drawings. While the invention will be described in conjunction with the preferred embodiments, it will be understood that they are not intended to limit the invention to these embodiments. On the contrary, the invention is intended to cover alternatives, modifications and equivalents, which may be included within the spirit and scope of the invention as defined by the appended claims. Furthermore, in the following detailed description of embodiments of the present invention, numerous specific details are set forth in order to provide a thorough understanding of the present invention. However, it will be recognized by one of ordinary skill in the art that the present invention may be practiced without these specific details. In other instances, well-known methods, procedures, components, and circuits have not been described in detail so as not to unnecessarily obscure aspects of the embodiments of the present invention. The drawings showing embodiments of the invention are semi-diagrammatic and not to scale and, particularly, some of the dimensions are for the clarity of presentation and are shown exaggerated in the drawing Figures. Similarly, although the views in the drawings for the ease of description generally show similar orientations, this depiction in the Figures is arbitrary for the most part. Generally, the invention can be operated in any orientation.

Notation And Nomenclature:

Some portions of the detailed descriptions, which follow, are presented in terms of procedures, steps, logic blocks, processing, and other symbolic representations of operations on data bits within a computer memory. These descriptions and representations are the means used by those skilled in the data processing arts to most effectively convey the substance of their work to others skilled in the art. A procedure, computer executed step, logic block, process, etc., is here, and generally, conceived to be a self-consistent sequence of steps or instructions leading to a desired result. The steps are those requiring physical manipulations of physical quantities. Usually, though not necessarily, these quantities take the form of electrical or magnetic signals capable of being stored, transferred, combined, compared, and otherwise manipulated in a computer system. It has proven convenient at times, principally for reasons of common usage, to refer to these signals as bits, values, elements, symbols, characters, terms, numbers, or the like.

It should be borne in mind, however, that all of these and similar terms are to be associated with the appropriate physical quantities and are merely convenient labels applied to these quantities. Unless specifically stated otherwise as apparent from the following discussions, it is appreciated that throughout the present invention, discussions utilizing terms such as "processing" or "accessing" or "executing" or "storing" or "rendering" or the like, refer to the action and processes of a computer system, or similar electronic computing device, that manipulates and transforms data represented as physical (electronic) quantities within the computer system's registers and memories and other computer readable media into other data similarly represented as physical quantities within the computer system memories or registers or other such information storage, transmission or display devices. When a component appears in several embodiments, the use of the same reference numeral signifies that the component is the same component as illustrated in the original embodiment.

Embodiments of this present invention provide a solution to the challenges inherent in implementing statistical process control methods in automated testing. In particular, embodiments of this invention may be used to make process decisions beyond simple pass/fail results by providing an opportunity to correct a production and/or testing process before many testing hours have been expended on devices (e.g. semiconductor wafers, system on a chip (SOC) or integrated circuits, etc.) being tested either incorrectly or on devices that have an inherent problem. In one exemplary embodiment of the present invention, a method for real-time statistical analysis of test results is disclosed. After a quantity of test results have been collected, statistical analysis of the collected test results may be performed and actions may be executed in response to any identified testing errors or defective devices, semiconductor wafers or dies. In particular, the statistical analysis may be performed during periods of reduced testing activities, such as during indexing time of prober and handling equipment. Furthermore, additional material handling commands (e.g., needle cleaning, z-height adjustment, stop, etc.) may be injected transparently between a testing program and a materials handler.

Statistical Process Control Analysis:

As described herein, statistical process control (SPC) rules may be executed in a short loop on an exemplary test cell controller. SPC rules provide early detection, notification, and control actions through statistical analysis of various test data parameters such as parametric test values, yield values, and bin results. The SPC rules may be executed in synchronicity with normal test cell controller program activities, such as handler and prober equipment communications. In one exemplary embodiment, SPC rules may be used to detect whether lot testing process results are in or out of control. For example, a Gaussian process parameter distribution which is running out of control may be characterized by a mean or standard deviation statistic which has drifted from an expected value. In a further example, iddq measurements (iddq testing is a method for testing integrated circuits for manufacturing faults) that are running higher than the normal standard deviation may indicate a die that will experience early failure because of internal breakdown. A go/no-go test will miss this while statistical process rule analysis may identify it. These statistical values can be monitored live during a lot test and identified SPC failures (e.g. control rule violations) can be used to trigger corrective or abortive actions. By detecting an SPC rule failure and discontinuing further testing, unnecessary testing time can be avoided, identified problems can be corrected, and yields and other evaluative metrics can be improved.

As described herein, exemplary embodiments utilizing SPC rule analysis may provide for the detection of historical results such as a bin that has had too many failures, a site that has yields lower than other sites, and statistical value results which are drifting from their in-control ideal values. SPC may also detect process issues on parts that are passing but are not within predicted process limits. For example, while parts may be passing within hard limits, violations of SPC rules, once detected in real-time, can be used to determine that process issues are present and may be addressed.

As described in detail below, an exemplary statistical analysis and process control framework executed on a test cell controller may provide many benefits. For example, non-invasively capturing measurement values and bin counts for the calculation of statistical results. Test suite execution may be synchronized without requiring the use of execution input library calls or prober/handler (PH) hook functions. In one exemplary embodiment, a test suite may be part of a test flow that defines one or more tests. In one exemplary embodiment, a test cell controller may execute a test flow comprising one or more test suites.

SPC rules, result analysis, and reporting may be centrally managed. SPC rules may also be integrated within existing test programs without requiring any changes to an application model. Prober and handler equipment may be controlled from SPC rule actions without the need for a custom driver when an existing driver has the required control capabilities. Lastly, custom SPC rules may be created for a specific testing environment and a specific device-under-test. Table 1 lists several exemplary SPC rules. Exemplary SPC rules may be custom designed for a particular type of data to be monitored, the type of rule itself, as well as the types of actions that may be implemented with the detection of the associated SPC rule violation. SPC rule data types, monitoring types, and actions are not limited to what is shown. Exemplary SPC rules may also include enhancements to monitor other types of data and use additional types of analysis and actions.

TABLE 1 example rule types, data monitored and actions taken

| Data Monitored | Rule Type | Actions |
|---|---|---|
| Yield | Limit monitoring | Email |
| Bin count | Site-to-site difference | Needle clean |
| Measured value | Trend monitoring | Retest |
| Prober/handler parameters | Marginal Monitoring | Z-height adjustment |
| Custom data source | | Stop test |

Test Cell with Integrated Statistical Analysis and Process Control:

As illustrated in FIG. 1, an exemplary automated test equipment 100 embodiment with integrated statistical process control comprises: a test cell controller 102, a testing apparatus 104, material handling equipment 106, a database server 112, and a web server 114 (e.g. containing control rule recipes and reports). The automated test equipment 100 may provide real-time statistical analysis of test results and an insertion of prober or handler commands that are transparent to a test program 103. In one exemplary embodiment, the material handling equipment 106 may comprise a prober 108 and a handler 110. In one exemplary embodiment, the prober 108 is a socket or probe card comprising a plurality of pins or needles that come in contact with a device-under-test (e.g., semiconductor wafer, die, etc.). As illustrated in FIG. 1, a test cell controller 102 may comprise a test program 103. The test program 103 may comprise an application model. The web server 110 may be used to enter SPC rules, analyze results and monitor process. The web server 110 may also comprise a web-based SPC editor for creating and editing SPC rules. In exemplary embodiments the web server 110 may be a desktop computer with a web browser. The testing apparatus 104, in addition to testing, may capture test result values, bin counts, and various types of yield counts used to test SPC rules. In one exemplary embodiment, a plurality of testing apparatuses 104 may be controlled by the test cell controller 102 and evaluated for statistical process control.

Results of data collection (raw and statistical) and SPC rules execution results may be stored on the database server 112. The web server 114 may access these stored results, as well as other tools, as described in detail below. Data in this database 112 may be analyzed during SPC rule evaluations. In one exemplary embodiment, as described in detail below, the test controller 114 further comprises a statistical analysis and process control framework that non-intrusively captures test results and tests the SPC rules with minimum overhead and a small code footprint.

SPC Rules Web-Based Editor:

In one exemplary embodiment, SPC rules, to be executed as described in detail below, are created and edited with a web interface (e.g., the web server 110) and stored in a relational database. Test program information may be imported to support rule editing (e.g., specific parametric values such as defined intervals, thresholds and trends may be selected or defined). This information may consist of software bin information, hardware bin information, a plurality of available test suites, and a plurality of available tests. As illustrated in FIG. 2, once a device-under-test 202, a test program 204 and a stage 206 have been selected 208 in an exemplary graphical user interface, a variety of rules related to the device-under-test 202 and the test program 204 may be selected, edited and defined in the web interface. The graphical user interface may further comprise a selection panel for selecting SPC rules. After a test program is selected, a list of SPC rules that relate to the selected test program may be selected from for verification of associated process control rules by statistical analysis of the test results generated from the selected test program.

As illustrated in FIG. 2, in one exemplary embodiment, a bin count rule selection panel 210 and a test value rule selection panel 212 are displayed. As described herein, in addition to the bin count and test value rules, selection panels for yield, test time, and recovery rate rules are also available with selection panels similar to those illustrated in FIG. 2 for bin count rules and test value rules. The bin count rule selection panel 210 may comprise a plurality of different selectable components depending on the type of rule. A Limit_Monitoring: Consecutive Bin Count rule 210*a* may comprise the following selectable components: a bin_type 220, a bin_num 222, a consecutive number 224, a per_site designation 226, an action 228, and an option to delete the rule 230. A Limit_Monitoring: Total Count Bin Count rule 210*b* may comprise the following selectable components: a bin_type 220, a bin_num 222, a total count 232, an action 228, and an option to delete the rule 230. As also illustrated in FIG. 2, a bin count rule 210 may also have a variety of different components/fields and produce differing rules as illustrated by the Limit_Monitoring: Consecutive Bin Count rule 202*a* and the Limit_Monitoring: Total Count Bin Count rule 202*b*.

The exemplary test value rule selection panel 212 may also comprise a plurality of different selectable components depending on the type of rule. As illustrated in FIG. 2, an exemplary Limit_Monitoring: Default Test Value rule 212*a* may comprise the following selectable components: a test name 240, a statistic 242, an interval 244, a sample size 246, a low limit 248, a high limit 250, a unit 252, an action 228, and an option to delete the rule 230. An exemplary Limit_Monitoring: Site-to-Site: Default Test Value rule 212*b* may comprise the following selectable components: a test name 240, a statistic 242, an interval 244, a sample size 246, a site-to-site difference percentage 252, an action 228, and an option to delete the rule 230.

As further illustrated in table 2, 5 different yield rules may be created and/or edited. As illustrated in table 2, each yield rule may be associated with a plurality of parameters. In one exemplary embodiment, the Limit_Monitoring: Accumulate rule verifies a yield total after every test flow execution (from one or more multiple sites). In one exemplary embodiment, the Limit_Monitoring: Rolling rule verifies a yield at an interval defined by the rule. In one exemplary embodiment, the Limit_Monitoring_Site_to_Site: Accumulate rule verifies a yield difference between sites after every test flow execution. In one exemplary embodiment, the Limit_Monitoring_Site_to_Site: Rolling rule verifies a yield at an interval defined by the rule, with the yield verification based on a site-to-site difference percent parameter. Lastly, in one exemplary embodiment, the Trend_Monitoring: Default rule may verify if a yield goes up or down for a number of consecutive times.

TABLE 2

| Creating and defining Yield rules |
|---|
| Limit__Monitoring: Accumulate:<br>Minimum sample size; Low limit; High limit; Per__site; Sim__Prod; and Actions |
| Limit__Monitoring: Rolling:<br>Rolling yield interval; Low limit; High limit; Per__site; Sim__Prod; and Actions |
| Limit__Monitoring__Site__to Site: Accumulate:<br>Minimum sample size; Site-to-site diff. percent; Sim__Prod; and Actions |
| Limit__Monitoring__Site__to__Site: Rolling:<br>Rolling yield interval; Site-to-site diff. percent; Sim__Prod; and Actions |
| Trend__Monitoring: Default:<br>Sample size; Interval; Per__site; Trend type; Trend count; Sim__Prod; and Actions |

As also illustrated in table 2, several parameters may be defined for each rule. The minimum sample size parameter may define a minimum number of devices to be tested before verifying an SPC rule. The low limit parameter may define a low limit yield value; the high limit parameter may define a high limit yield value. The per_site parameter may be defined as YES when verifying per site, and NO when all sites are combined. The Sim_Prod parameter may define whether the test is on production data or a simulation. The action parameter may define which action is to be implemented (e.g., email, stop, needle clean, etc.). The rolling yield interval parameter may define the number of devices to be tested before an SPC rule is verified. The site-to-site differential percent parameter may define a maximum yield difference between any sites (e.g., if set to 10%, the rule will fail if there's a yield difference greater than 10% between sites). The sample size parameter may define a minimum number of devices to test before rule verification. The interval parameter may define an interval between verifications of an SPC rule. The trend type parameter may define a type of trend (e.g., ASCEND will verify if the yield goes up for a number of times specified, while DESCEND will verify if the yield goes down for a number of times specified). The trend count parameter defines when the rule will fail if this count is reached.

As described herein and illustrated in table 3, in one exemplary embodiment, 4 different bin count rules may be created and defined. Each bin count rule may be associated with a plurality of parameters. In one exemplary embodiment, the Limit_Monitoring: Consecutive rule may check if a maximum number of consecutive bin failures has been exceeded. In one exemplary embodiment, the Limit_Monitoring: Total_Count rule may check that a total count for a specific hardware or software bin does not exceed a defined count parameter. In one exemplary embodiment, the Limit_Monitoring: Total_Percent rule may check that the total percentage for a specific hardware or software bin does not exceed a defined percent parameter. In one exemplary embodiment, the Limit_Monitoring_Site_to_Site: Accumulate rule may check that a difference in hardware or software bins, expressed in percentage, cannot exceed a defined value between sites.

TABLE 3

| Creating and defining Bin Count rules |
|---|
| Limit__Monitoring: Consecutive:<br>Bin type; Bin number; Consecutive; Per__site; Sim__Prod; and Actions |
| Limit__Monitoring: Total__Count:<br>Bin type; Bin number; Total Count; Sim__Prod; and Actions |
| Limit__Monitoring: Total__Percent:<br>Bin type; Bin number; Sample size; Total percent; Sim__Prod; and Actions |
| Limit__Monitoring__Site__to__Site: Accumulate:<br>Bin type; Bin number; minimum sample size; Site-to-site diff. percent; Sim__Prod; and Actions |

As also illustrated in table 3, several parameters may be defined for each rule. The bin type parameter may define whether the bin is a software bin or a hardware bin. The bin number parameter may define a particular bin. The consecutive parameter may define a maximum number of consecutive bin failures. The per_site parameter may be defined as YES when verifying per site, and NO when all sites are to be combined. The sim_prod parameter may define whether the test is on production data or a simulation. The action parameter may define which action is to be implemented (e.g., email, stop, needle clean, etc.). The total count parameter may be defined as a maximum count for a give hardware bin or software bin. The sample size parameter may be defined as a minimum number of devices to be tested before an SPC rule verification is performed. The total percent parameter may be defined as a maximum percentage for a given hardware bin or software bin. The minimum sample size parameter may be defined as a minimum number of devices to be tested before verification. The site-to-site diff. percent parameter may define a maximum yield difference between any sites.

As discussed herein and illustrated in table 4, in one exemplary embodiment, 3 different bin recovery rate rules may be created and defined. As illustrated in table 4, each bin recovery rate rule is associated with a plurality of parameters. In one exemplary embodiment, the Limit_Monitoring:Bin_Recovery_Rate rule may check for a percentage of recovered parts for a given bin based on a total of all failed bin counts in a first pass. In one exemplary embodiment, the following formula is used: bin count recovered/total of all failed bin counts in first pass*100. In one exemplary embodiment, the Limit_Monitoring:Bin_Recovery_Rate Efficiency rule may check a percentage of recovered parts for a given bin based on a bin count in a first pass. In one exemplary embodiment, the following formula is used: bin count recovered/bin count in first pass*100. In one exemplary embodiment, the Limit_Monitoring:Overall_Recovery_Rate rule may check a percentage of recovered parts for all bins based on a total of all bin counts in a first pass. In one exemplary embodiment, the following formula is used: all bin counts recovered/total number of all bin counts in a first pass*100.

TABLE 4

| Creating and defining Bin Recovery Rate rule |
|---|
| Limit_Monitoring:Bin_Recovery_Rate: |
| Bin type; Bin number; low limit percent; high limit percent; Sim_Prod; and Actions |
| Limit_Monitoring:Bin_Recovery_Rate_Efficiency: |
| Bin type; Bin number; low limit percent; high limit percent; Sim_Prod; and Actions |
| Limit_Monitoring:Overall_Recovery_Rate: |
| Low limit percent; high limit percent; Sim_Prod; and Actions |

As also illustrated in table 4, several parameters may be defined for each rule. The bin type parameter may define whether a bin is a software bin or a hardware bin. The bin number parameter may define a particular bin. The low limit percent parameter may define a low limit for a percentage of recovered parts. The high limit percent may define a high limit for a percentage of recovered parts. The sim_prod parameter may define whether the test is on production data or a simulation. The action parameter may define which action is to be implemented (e.g., email, stop, needle clean, etc.) when an SPC rule fails.

As discussed herein and illustrated in table 5, in one exemplary embodiment, 4 different test value rules may be created and defined. As illustrated in table 5, each test value rule is associated with a plurality of parameters. In one exemplary embodiment, the Limit_Monitoring:Default rule may verify a test statistic (e.g. mean, standard deviation, process capability index (CPK), etc.) against a high limit and a low limit at regular intervals defined by an interval parameter. The data compiled for each statistic is accumulated beginning with a first device tested (with any statistical analysis performed after collecting a minimum number of samples). In one exemplary embodiment, the Limit_Monitoring:Site_to_Site:Default rule may verify a test statistic (e.g. mean, standard deviation, process capability index (CPK), etc.) across sites, comparing a difference in percentage against a site-to-site difference percent limit at regular intervals defined by the interval parameter. The data compiled for each statistic is accumulated beginning with a first device tested (with any statistical analysis performed after collecting a minimum number of samples). In one exemplary embodiment, the Trend_Monitoring:Default rule may verify if a selected test statistic goes up or down in value for a number of consecutive times.

In one exemplary embodiment, the Marginal Monitoring: Default rule may verify a mean of a test against a high margin and a low margin expressed in sigma at regular intervals defined by the interval parameter. The data compiled for each statistic is accumulated beginning with a first device tested (with any statistical analysis performed after collecting a minimum number of samples). In one exemplary embodiment, each test may be defined with a minimum sample size, an interval, a low margin, and a high margin (the margins expressed in sigma-standard deviation) for a difference between the test limits and the mean. In one exemplary embodiment, at run-time, an SPC module may start checking the marginal rule after a minimal sample of test executions. An SPC rule may be executed periodically at a defined interval (e.g., the SPC rule is verified or checked, etc.). In one exemplary embodiment, the SPC module may calculate a difference between a low limit and an average value of a specified test and determine if the average value is higher than a low margin parameter to pass the rule. A difference between the high limit and the average value of the specified test will also be checked to see if the average value is higher than a high margin parameter value.

TABLE 5

| Creating and defining test value rules |
|---|
| Limit_Monitoring:Default: |
| Test name; Statistic; Interval; Sample size; Low limit; High limit; Unit; Sim_Prod; and Actions |
| Limit_Monitoring_Site_to_Site:Default: |
| Test name; Statistic; Interval; Sample size; Site-to-site diff. percent; Sim_Prod; and Actions |
| Marginal_Monitoring:Default: |
| Test name; Statistic; Interval; Sample size; Margin_low; Margin_high; Unit; Sim_Prod; and Actions |
| Trend_Monitoring:Default: |
| Test name; Statistic; Interval; Sample size; Trend type; Trend count; Sim_Prod; and Actions |

Table 5 also illustrates that several parameters may be defined for each rule. The test name parameter may define which SPC test is selected for monitoring. The statistic parameter may define a particular statistical evaluation to be executed (e.g. MEAN, MIN, MAX, STD, CP, SPK, CPL, and CPU, etc.). The interval parameter may define an interval at which an SPC rule is verified. The sample size parameter may define a minimum number of test executions that must be executed before the rule is checked for the first time. The low limit parameter may define a low limit for the selected statistic. The high limit parameter may define a high limit for the selected statistic. The unit parameter may define a desired measurement, such as microamperes, etc. The sim_prod parameter may define whether the test is on production data or a simulation. The action parameter may define which action is to be implemented (e.g., email, stop, needle clean, etc.). The site-to-site difference percent may define a maximum percentage difference allowed between any sites for a given statistic. The margin_low parameter may define a minimum difference in sigma between a mean and a low limit. The margin_high parameter may define a minimum difference in sigma between a mean and a high limit. The interval type parameter may define an interval between verifications. The trend type parameter may define a type of trend (e.g., selecting ASCEND will verify whether the yield goes up for a number of times specified, while selecting DESCEND will verify whether the yield goes down for a number of times specified). The trend count parameter may define a count that when reached fails the rule.

As described herein, an exemplary test time rule may also be created and defined. Each test time rule may be associated with a plurality of parameters. In one exemplary embodiment, a test time rule may verify a minimum, maximum, or mean of a test suite test time against a high limit and a low limit at regular intervals defined by an interval parameter. In one exemplary embodiment, several parameters may be defined for a test time rule. In one exemplary embodiment, a test time rule comprises the following parameters: a test suite parameter, a statistic parameter, a sample size parameter, an interval parameter, a low limit parameter, a high limit parameter, a unit parameter, a sim_prod parameter, and an action parameter. The test suite parameter may define one or more SPC test cells that may be selected for monitoring. The statistic parameter may define a selected statistical test (e.g., MEAN, MIN, and MAX, etc.). The sample size parameter may define a minimum number of test suite executions before an SPC rule is checked for the first time. The interval parameter may define an interval at which a rule is verified. The low limit parameter may define a low limit for a selected statistic. The high limit parameter may define a high limit for a selected statistic. The unit parameter may define a desired measurement, such as microamperes, etc. The sim_prod parameter may define whether the test is on production data or a simulation. The action parameter may define which action is to be implemented (e.g., email, stop, needle clean, etc.) when an SPC rule fails.

As illustrated in FIG. 2 and tables 2-5, and discussed herein, exemplary SPC rules may be customized. Exemplary embodiments of a web-based editor, as described herein, may provide a solution which is available for multiple types of computers. By storing the rules in a database, exemplary statistical analysis and process control framework embodiments may make them available to other tools and may also make it possible for other tools to create the SPC rules as compared to a solution which stores the SPC rules in a proprietary format. While the rules illustrated and discussed herein may be created and customized, other control rules are also possible, with additional selectable parameters to be defined.

An exemplary customizable utility may import basic information regarding a test program. This import utility may aid in determining what bins, values, and data can be applied to the SPC rules before the test program has been run. The import utility can capture this data and make it available to the web editor so that SPC rule options are based on the actual device to be tested and the test program to be used. The import utility provides a complete list of test IDs, test names, test suites, test units and limits, and software/hardware and bin numbers. These specific test particulars can then be used by a web editor to set up exemplary SPC rules.

In one exemplary embodiment, the import utility may depend on a type of device being tested at least once before SPC rules are in place. After at least one testflow execution, the import process can take place. In one exemplary embodiment, this operation may be part of the product release to production. Therefore, after the import has been performed, any desired SPC rules can be created. An exemplary SPC Rules web-based editor, as discussed herein, provides for the importation of test names, test suites, and bins from actual test program execution results. In one exemplary embodiment, control can be exerted as to how a control rule is to be applied. Such control may also be exerted to define how soon testing is to take place so that a yield total or some other statistical measurement is not calculated before a proper sample has been gathered.

In one exemplary embodiment, multiple actions for each rule failure may be specified. Further, when more than one rule fails, an order of executing the actions may be determined. An exemplary statistical analysis and process control framework may take into account the severity of individual SPC rule actions when evaluating them. For example, an SPC rule that causes a stop when violated is more serious than one that requires a needle cleaning. In one exemplary embodiment, as discussed herein, bin rules can be based on either a software bin or a hardware bin. This can provide a powerful control because software bins may allow a check on very specific test failures while hardware bins can sometimes be multiple failures grouped together.

An exemplary web server 110, as illustrated in FIG. 1, may allow the entry of SPC rules and provide a display of SPC rule execution results. Using a display window, as illustrated in FIG. 3, the SPC rule results of a test program execution may be viewed. As illustrated in FIG. 3, once a device-under-test 202, a test program 204 and a stage 206 have been selected 208; a variety of test results may be viewed. As further illustrated in FIG. 3, with the selection of a device-under-test 202 and a test program 204, a particular test cell 302, a rule type 304, lot ID 306, and wafer ID 308 may be selected 310. Such selections may allow the analyze of test results for a particular test cell 302, rule type 304, lot ID 306 or wafer ID 308. In one exemplary embodiment, the wafer ID 308 may be a device ID, a system-on-a-chip (SOC) ID, or an integrated circuit ID.

As further illustrated in FIG. 3, test results for yield rule executions are illustrated. The yield rule test results panel 312 comprises a plurality of components that were defined in the SPC rules editor illustrated in FIG. 2. As illustrated in FIG. 3, in one exemplary embodiment, the test results may comprise a start-time value 320, a host_name 322, a lot_ID 324, a wafer_ID 326, a min_sample_size value 328, a low_limit value 330, a high_limit value 332, a per_site field 334, an action selected 336, and rule results 338 for each test, as sorted. As illustrated in FIG. 3, individual test results may be provided for each of the wafer IDs 326.

The exemplary display may be filtered by device, lot, and sort number. The results of this display window may be live, but delayed by 30 seconds. In one exemplary embodiment, SPC rule verification results may be stored in a database within 30 seconds. In one exemplary embodiment, new SPC rules may only be applied to a next lot to be tested. This ensures that an SPC rule is never changed mid-lot. As described in detail below, the web server 110 may be integrated into a statistical analysis and process control framework that provides SPC rule execution (e.g., verification of rules and actions executed for rule failures) and an optimized process control. As described below, SPC rules may be executed in either a short loop control and/or a long loop control.

SPC Rules Execution in a Short Loop Control:

As described in detail below, in one exemplary embodiment, the execution of SPC rules may be divided into a short loop control or a long loop control. A short loop control rule provides process control within a test cell based upon immediately available data. A short loop control may be executed during periods of reduced testing, such as during an index time of the prober 108 and the handler 110 of the handling equipment 106 (a period of time from the end of a current test flow and the beginning of a next test flow execution, e.g, the time it takes to position the probe 108 from one XY position on a wafer to another XY position on the wafer) or when the handling equipment 106 (e.g., the handler 110) is preparing for a next lot or die to test. When a test flow completed event is received from the test suite program, a state machine may trigger a verification of SPC rules and resultant actions may be taken if an SPC rule fails. In one exemplary embodiment, a short loop control may provide an analysis and an action as illustrated in table 6. For example, if a prober or handler action is requested in response to an SPC rule violation, a state machine may put the prober or handler drivers on hold before the next device is executed.

TABLE 6

| Example short loop control rules<br>Exemplary Short Loop Control SPC rules: |
|---|
| Stop a prober if a maximum number of consecutive errors or defects (e.g. open/short) for a current bin is exceeded. |
| Perform a needle cleaning if a total number of failures for a current bin exceed SPC limits for the device. |
| Send an email if a standard deviation of an iddq test falls outside of pre-defined limits. |
| Perform a custom action if a site-to-site yield difference is greater than 10%. |

In one exemplary embodiment, based on current data and results which may be stored in a test cell controller memory, a short loop control may be implemented. This short loop may be synchronized with a handling equipment/prober index time (e.g. pauses in testing for various reasons as discussed herein) to reduce impact on throughput. The results may be evaluated immediately after testflow execution. Therefore, in one exemplary embodiment, the test execution may be stopped after the most recent die or package. Exemplary embodiments compare process control parameters against known metrics based on a current lot execution. For example, an SPC rule may determine whether an iddq standard deviation statistical result has gone above a limit for a lot being tested.

SPC Rule Execution in a Long Loop Control:

An exemplary long loop control may be based on an analysis of historical data (e.g., data stored in a database and compared across testers, lots, and testing locations). An exemplary embodiment may execute SPC rules in a long loop with a central database. Actions may still occur after testflow execution, but are based on data previously gathered. In one exemplary embodiment, the stored data is from previous lots or other test cells. A long loop control may compare process control parameters against known metrics and data from previous executions. For example, 10 test cells may be testing a same type of device, lot or die. In this example, statistical analysis has determined that 1 of the 10 test cells is delivering a yield 10% less than the other 9 test cells. In this example, the subject failing test cell may be pulled off-line and a failing component, such as a channel card, identified and replaced. With the failing channel card replaced, follow-on statistical analysis may show that the measured yield has jumped back to normal for the subject test cell. Note: yield statistics may still be acceptable in a short loop rule analysis, but fail when compared to previous lots in a long loop. In one exemplary embodiment, SPC rules may also be executed in a long loop which compares test results from test floor-to-test floor, tester-to-tester, lot-to-lot, and wafer-to-wafer.

Comparison Between Short Loop and Long Loop:

An exemplary short loop rule analysis allows a user to check process control parameters against known absolutes for a device under test, such as maximum standard deviation and minimum yield. An exemplary long loop control allows a user to check process control parameters against what is normal for the type of device under test, and a test program such as normal yield. Long loop rule analysis allows the user to detect a deterioration of test results across lots (time), test cells, and wafers. Both short and long loop controls may help to identify process control changes caused by bad tester hardware, changes in fabrication processes, incorrect settings, or faulty handling equipment, contactors, or probe cards, for example. An exemplary short loop may be used to assure that a basic process is within defined limits, while an exemplary long loop allows the comparison of historical normal process results against the current results.

Figure 4:
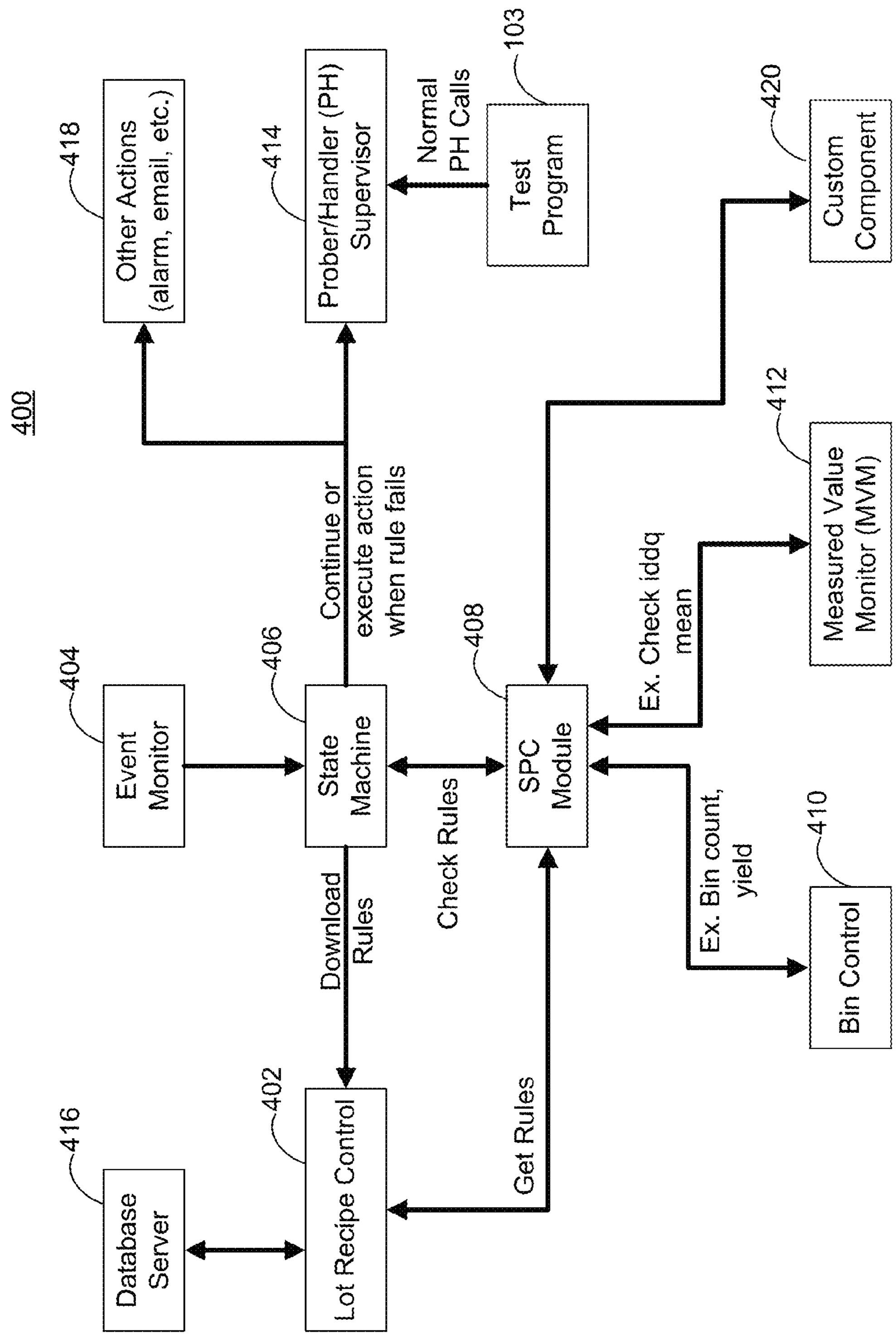
FIG. 4 illustrates an exemplary block diagram of a statistical analysis and control apparatus for real-time management of statistical process controls in accordance with an embodiment of the present invention.

Statistical Analysis and Process Control Framework:

An exemplary statistical analysis and process control framework is illustrated in FIG. 4. The modules illustrated in FIG. 4 make up the main components of the statistical analysis and process control framework. These exemplary modules may perform their individual tasks under the direction of a state machine which is synchronized by a test cell controller 102. In one exemplary embodiment, all modules of the statistical analysis and process control framework run on the test cell controller 102 with most of the CPU loading occurring during index time of the prober 108 and handler 110 of the handling equipment 106 (e.g., periods of testing inactivity while a test testflow is prepared for execution). During periods of reduced testing activities of the test program 103, increased computational capacity is available for result computation, as described in detail below.

As illustrated in FIG. 4, an exemplary statistical analysis and process control framework 400 comprises a lot recipe control module 402, an event monitor 404, a state machine 406, a statistical process control (SPC) module 408, a bin control module 410, a measured value monitor (MVM) 412, and a prober/handler (PH) supervisor 414. An exemplary lot recipe control module 402 may query a database server 416 for desired SPC rules when requested by the state machine 406. In one exemplary embodiment, this occurs at the beginning of a testing of a lot.

In one exemplary embodiment, the modules making up the statistical analysis and process control framework 400 may be interconnected by a test cell communications framework. In one exemplary embodiment, inter-module commands may be implemented using architecture independent shared memory structures and common semaphore synchronization patterns. In one exemplary embodiment, inter-module commands may comprise a command and associated parameters (e.g., command parameters may be a dictionary of key value pairs, raw text, or raw binary). The use of architecture independent shared memory structures and common semaphore synchronization patterns may allow the inter-connected modules to send and receive commands and receive event notifications quickly and efficiently. In one exemplary embodiment, modules may communicate commands directly to one another instead of routing through a central service, and event notifications, as described herein, may be implemented with message queues and buffers. Events may be routed through a central dispatcher, such as an event monitor 404, which then forwards the event notification to all modules. As discussed herein, commands (e.g. commands from the state machine 406 to the SPC module 408) may be sent directly from a point of origination to a destination module, while event notifications may be sent from a point of origination to all modules on the test cell communications framework.

An exemplary test cell communications framework may supply event notices to the modules of the statistical analysis and process control framework 400 so that the modules may follow testing progress. In one exemplary embodiment, upcoming computational windows of available computation resources may be anticipated or forecasted so that SPC rule execution can take place in real-time but without test progress disruption. Event notifications may be sent non-synchronously, while commands may be generated synchronously.

As described in detail below, actions of the modules, such as the state machine 406 and the SPC module 408 may be dependent upon receiving event notifications concerning activities in the test cell. The event notices inform the interconnected modules what events are happening and where in the test flow the test cell currently is. For example, the state machine 406 may use event notifications to trigger the SPC module 408 to enter a round of SPC rule verifications when event notifications report that a period of reduced testing has been entered (e.g., when a period of prober/handling equipment indexing has begun, e.g., when a lot or die has finished testing and a next lot or die is being located and moved into test position, or when a current test flow at an XY position is completed and the probe 108 is moved to a new XY position, etc.). In one embodiment, the SPC module 408 performs SPC rule verifications as directed by commands from the state machine 406, wherein the state machine tracks the state of the testing process, e.g., where in the testing process the test cell is and what SPC rules are ready to be verified. In one exemplary embodiment, SPC rules that are executed at the start of or end of a die or lot or after a needle cleaning or other change may be dependent upon event notifications received. For example, the SPC module 408 may perform SPC rule verifications when specific test conditions have been met, such as a predetermined quantity of parts tested (e.g., an interval) before a next execution of an SPC rule, or at a beginning or end of a test. As discussed herein, in one exemplary embodiment, the SPC rule verifications may be performed by the SPC module 408 as directed by commands from the state machine 406 as determined by received event notifications.

The event monitor 404, illustrated in FIG. 4, may provide events that cause state transitions in the state machine 406. The events may also be available to other modules. Exemplary examples of events are TESTPROGRAM_EXEC_STARTED, TESTPROGRAM_EXEC_COMPLETED, LOT_STARTED, and TESTFLOW_EXEC_COMPLETED. An exemplary state machine 406 may track a current state by transitioning on events. These exemplary state transitions may execute exemplary function callbacks which may cause SPC rules to be evaluated. In one exemplary embodiment, the state machine 406 may synchronize SPC rules download, evaluation, action execution, and reporting. As discussed herein, event notifications generated by the event monitor 404 may be transmitted via the test cell communications framework to all modules of the statistical analysis and process control framework 400 so that modules, such as the state machine 406 and SPC module 408 may be notified when key events occur. In one exemplary embodiment, as described herein, the state machine 406 may send commands to the SPC module 408 for SPC rules verification based upon received event notifications.

An exemplary SPC module 408 may use the SPC rules queried at the beginning of a lot, and under the control of the state machine 406, execute those rules at required intervals. The exemplary statistical process control module 408 may also use the bin control module 410 and the MVM module 412 for SPC data. In one exemplary embodiment, the SPC module 408 executes the SPC rules (e.g. performs all verifications and evaluations of SPC rules). An exemplary bin control 410 may track overall bin counts, consecutive bin counts, and yield (overall and per site) values. In one exemplary embodiment, the bin control 410 keeps track of yield and binning values.

An exemplary MVM module 412 may track values and test time statistics overall and per site, and also capture raw data at 30 second intervals. In one exemplary embodiment, an MVM module 412 may monitor test results and provide on-the-fly statistical computations. An exemplary prober/handler supervisor 414 may load and control the execution of a prober or handler driver as requested by an application model or a state machine 406. In one exemplary embodiment, a prober/handler supervisor 414 may provide programmable hold-off states for executing SPC rule-initiated actions (example: needle cleaning). As discussed below, the hold-off states may hold prober or handler commands issued from a test program 103 while a prober or handler command issued from the state machine 406 is executed. Such a hold-off is transparent to the test program 103.

In one exemplary embodiment, the statistical analysis and process control framework 400 may allow for efficient communication with and control of modules which can collect SPC required data such as parametric test value statistics and test time statistics. The framework may then allow the quick and transparent execution of SPC actions in a short loop when an SPC rule fails. In one exemplary embodiment, the short loop SPC rules are checked with minimum overhead and actions in response to detected process control rule failures can occur quickly. Exemplary statistical analysis and process control framework 400 embodiments are able to achieve this by providing very fast communications that include inter-module commands and event notifications. Such communications may be coordinated with a state machine module 406. Therefore, every module may be aware of crucial test cell events such as an end of testflow execution or a test cell program being ready to run.

In one exemplary embodiment, the statistical analysis and process control framework 400 uses a modular architecture with components (e.g., modules) that implement specific actions. The heart of an exemplary statistical analysis and process control framework 400 is the state machine module 406 which coordinates a query for SPC rules, SPC rule execution (e.g. verification), and execution of required actions. The state machine module 406 communicates with each of the modules required to evaluate an SPC rule. In one exemplary embodiment an MVM module 412 may provide both raw and statistical data on measured values and test suite test times. The bin control module 410 can provide both bin counts and yield (both overall and per site). The prober/handler supervisor 414 may also hold off further test execution when necessary. A next test flow may be executed while the SPC rules are evaluated.

Figure 5:
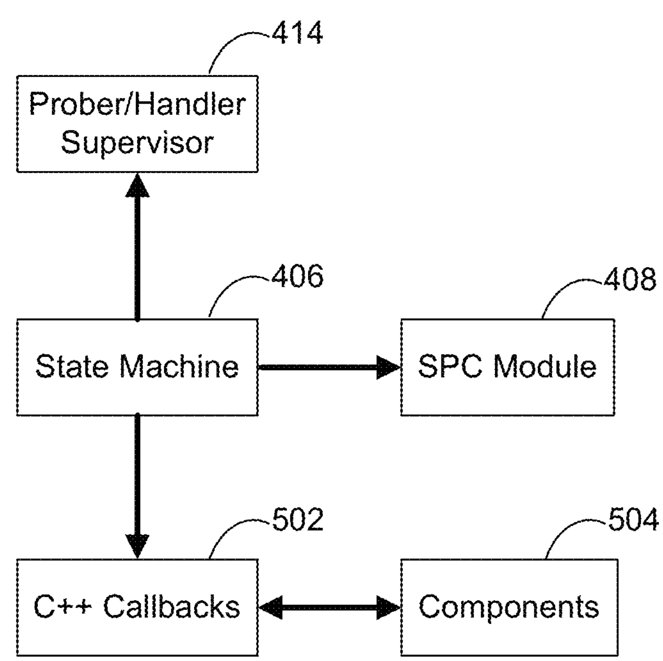
FIG. 5 illustrates an exemplary customizable state machine component of a statistical analysis and control apparatus in accordance with an embodiment of the present invention.

State Machine Module:

As illustrated in FIGS. 4 and 5, a customizable state machine module 406 may synchronize all components with a test cell controller 102 and material handling equipment 106. A tabular-driven state machine module 406 may be defined in an exemplary state$_{13}$machine.xml file. In other embodiments, other file formats may be used. This file may describe how events cause transitions from one state to another and which C++ callback function 502 should be called upon a state change. The C++ callbacks 502 may implement SPC rule actions (rule verifications, etc). This XML file defines possible events and current states and for a current state and event, what the next state is. Each transition may have a callback and transition ID. An exemplary state_machine.xml may also define all possible states and provide for unique call backs for identical transitions but caused by different events. Each exemplary callback which executes on a specific transition may communicate with the statistical analysis and process control framework modules to produce specific actions (e.g. checking SPC rules or executing actions).

A tabular state machine module 406 may allow the use of programming code that is easy to understand, modify, and support, as compared to a state machine which is hard coded. The SPC module 408 may execute the SPC rules as directed by the state machine module 406. In one exemplary embodiment, the state machine module 406 does not know what SPC rules will be executed by the SPC module 408. In other words, while the state machine module 406 may send a trigger to the SPC module 408 to begin SPC rule executions based on received event notifications (e.g., identifying specified intervals or desired computational windows for efficient processing), the state machine module 406 does not know what SPC rules will be verified in response to the SPC rule trigger). The state machine module 406 may arbitrate between the modules, and when a command has been sent that causes a physical action (e.g., a command to the prober/handler supervisor 414) or some other action, the state machine module 406 may arbitrate when conflicting commands have been sent.

Figure 6:
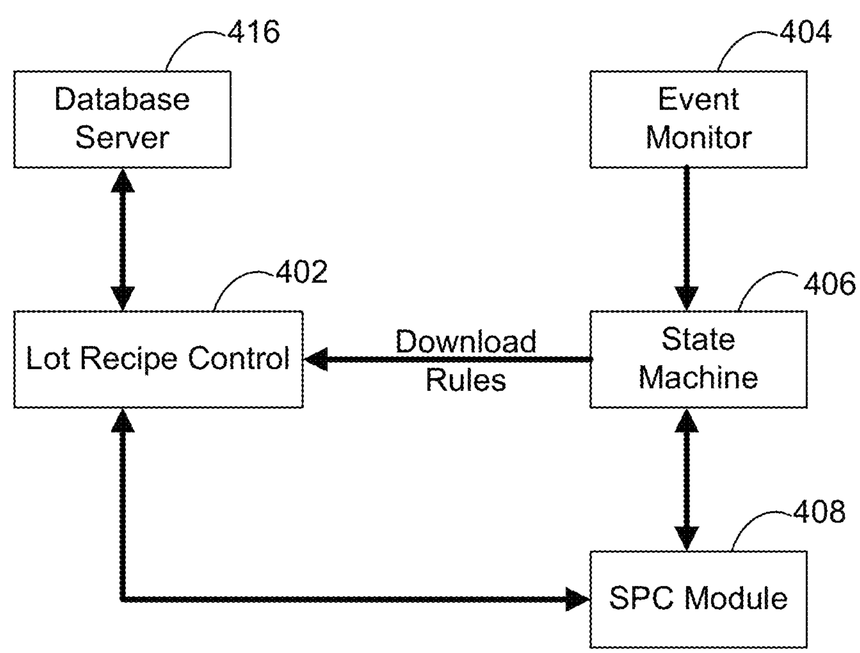
FIG. 6 illustrates an exemplary lot recipe control component of a statistical analysis and control apparatus in accordance with an embodiment of the present invention.

Lot Recipe Control Module:

As illustrated in FIGS. 4 and 6, an exemplary lot recipe control module 402 provides an interface with the database server 416. When a lot starts, the lot recipe control module 402 downloads a lot recipe from the database server 416, including SPC rules. In one exemplary embodiment, a lot recipe control module 402 may provide the ability to query the database 416 for SPC rules based on the current device under test, test program, and/or sort number. In one exemplary embodiment, these SPC rules may have been previously stored by a test or product engineer. The lot recipe control module 402 queries the database 416 for the SPC rules and then formats them into C++ data structures which are used by the SPC module 408 to evaluate, execute, and determine actions for each SPC rule violation. An SPC rules download may be triggered by the state machine module 406 when a new lot is started (as determined by received event notifications). In one exemplary embodiment, any other module can query the current set of SPC rules, but the SPC module 408 has the main responsibility for SPC rule execution.

Figure 7:
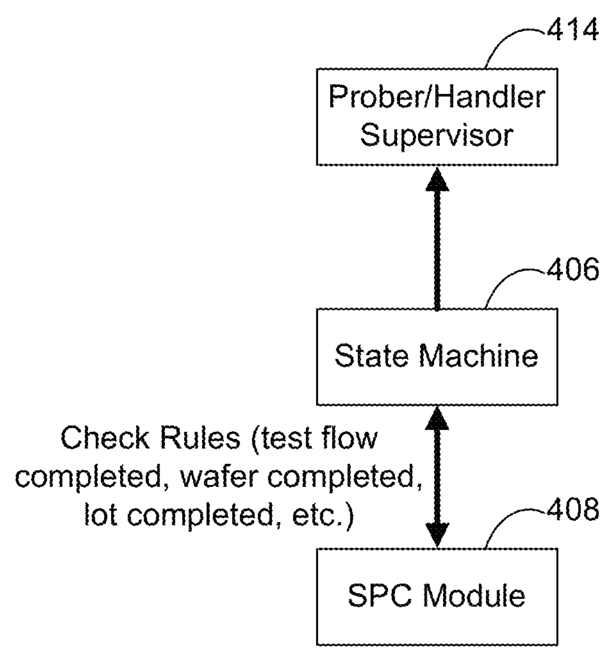
FIG. 7 illustrates an exemplary statistical process control component of a statistical analysis and control apparatus in accordance with an embodiment of the present invention.

Statistical Process Control (SPC) Module:

As illustrated in FIGS. 4 and 7, an exemplary SPC module 408 may be responsible for executing SPC rules and determining whether actions are required. In one exemplary embodiment, the SPC module 408 may be called by the state machine module 406 in specific states such as prober/handling equipment indexing, end of wafer, and end of lot, etc. In one exemplary embodiment, when an SPC rule fails, the SPC module 408 may return the results and any requested/required actions to the state machine module 406. In one exemplary embodiment, the state machine 406 executes the requested actions. SPC rules results may be stored in the database 416 within 30 seconds. In one exemplary embodiment, SPC rules results may be stored in the database 416 according to a configurable parameter. The configurable parameter may set an interval at which data is sent to the database 416. For example, any interval, such as 5, 10, or 30 seconds can be selected.

In one exemplary embodiment, the SPC module 408 uses the SPC rules from the lot recipe control module 402 and determines when SPC rules are to be verified, which parameters to check, and what action to execute for a rule failure. In one exemplary embodiment, the SPC module 408 only evaluates the SPC rules and leaves the rule actions (e.g. actions in response to rule failures) to the state machine 406. The SPC module 408 communicates pass/fail status and actions to the state machine module 406. In one exemplary embodiment, the state machine module 406 executes SPC rule evaluations by calling the SPC module 408 and then receiving the results of the SPC rule executions from the SPC module 408. In one exemplary embodiment, the SPC rules can be evaluated at the end of a testflow evaluation, the end of a wafer, or the end of a lot. Such evaluations can be timed to occur during an index time of the prober 108 and handler 110 of the handling equipment 106, (e.g., an idle time between the end of a last test flow and the beginning of a next test flow execution, where various operations may be carried out, such as device switch out, binning, moving a probe 108 from one XY location on a wafer to another XY location, etc.).

Prober/Handler (PH) Supervisor:

As illustrated in FIGS. 4 and 15, and described in detail below, an exemplary prober/handler supervisor 414 may receive multiple commands from multiple points of origination that are arbitrated by the prober/handler supervisor 414 as directed by the state machine module 406. Commands received from the test program 103 may be placed on hold while commands from the state machine module 406 and the SPC module 408 are executed by the prober/handler supervisor 414. Once the prober or hander commands are completed the hold may be released. As described below, the interposition of the prober or handler commands from the state machine module 406 will be transparent to the application model of the test program 103. For example, if an application model of the test program 103 is querying for a new part to test, a command may be issued by the test program 103 to determine what parts for test are available, while in the background, the state machine module 406 may decide to place any commands from the test program 103 on hold at the prober/handler supervisor 414 while another prober or handler command from the state machine module 406 is executed first.

Figure 8:
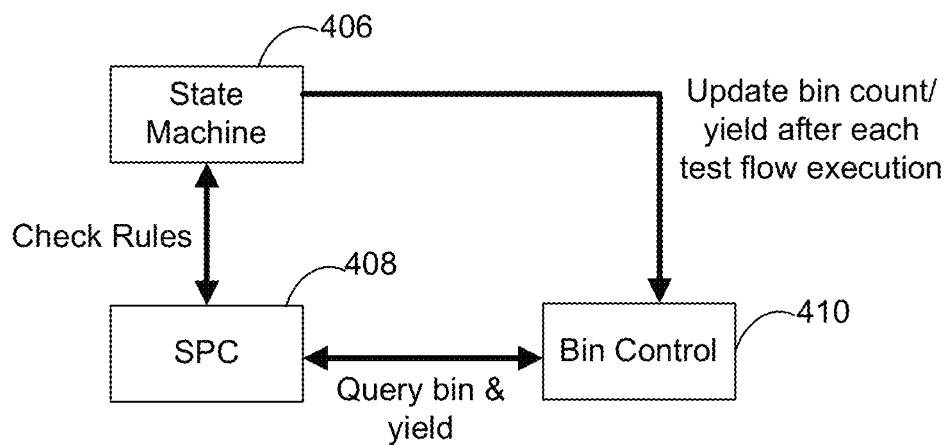
FIG. 8 illustrates an exemplary bin control component of a statistical analysis and control apparatus in accordance with an embodiment of the present invention.

Bin Control Component:

As illustrated in FIGS. 4 and 8, an exemplary bin control module 410 may keep track of binning and yield values. The bin control module 410 can provide a command interface for the SPC module 408 and any other component that needs access to this information (e.g., a yield monitor or a wafer map display). In one exemplary embodiment, a bin control module 410 may evaluate both software and hardware bin counts and yield counts for both overall and per site. An exemplary bin control module 410 may also keep track of consecutive bin counts. These counts plus overall and per site yield may be used to implement the SPC rules which track these numbers.

Figure 9:
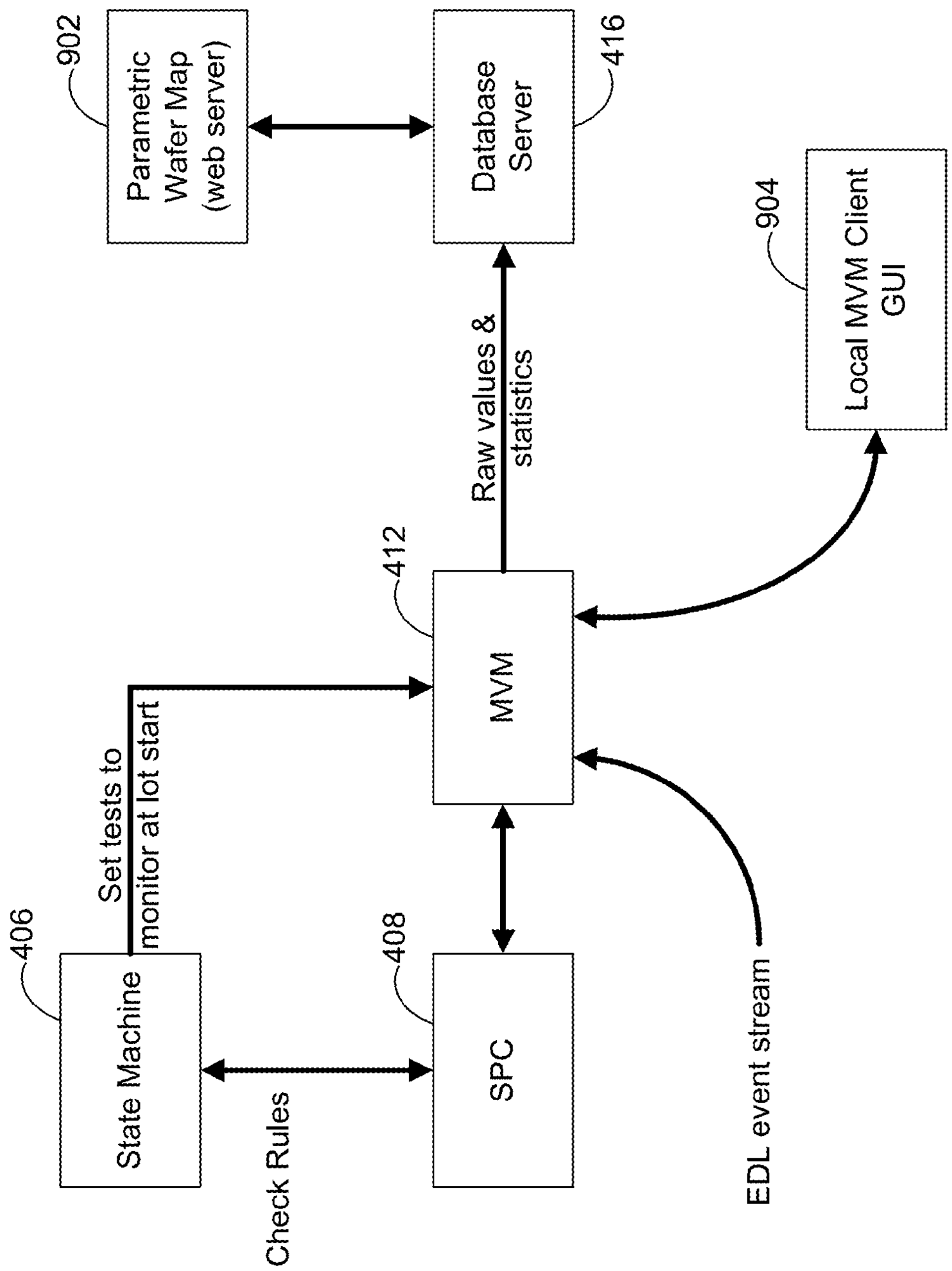
FIG. 9 illustrates an exemplary measured value monitor component of a statistical analysis and control apparatus in accordance with an embodiment of the present invention.

Measured Value Monitor (MVM) module:

As illustrated in FIGS. 4 and 9, an exemplary MVM module 412 may perform one or more of the following actions listed in table 7:

TABLE 7

| |
|---|
| Process test cell program event data logging events. |
| Capture and store measured values (such values can be held in memory for very fast calculations and access). |
| Perform statistical analysis in real-time (e.g. mean, min, max, STD, CPK, etc.). |
| Selectively capture values. |
| Store values in local XML files for import into a database. |
| Utilize a command set to control operations and access results. |
| Provide options for capture of raw data and/or reporting of statistical results. |
| Capture test suite test times and provide test time statistics. |

In one exemplary embodiment, an MVM module 412 may be a test program event data logging (EDL) client which can capture measured values and test suite test times. In one embodiment, the EDL event stream may be a test program event stream which contains test information and test results. The MVM module 412 may also monitor the EDL event stream and capture useful data, either live while the test program 103 is running or offline using a saved data collection file. The MVM module 412 may process the EDL event stream in both online and offline modes. The MVM module 412 processes captured values from many test executions to report statistical data such as mean, min, max, and standard deviation. The MVM module 412 also collects the start and completion timestamp for each test cell execution so that it can report test suite test times. These measurements can be used to generate statistical data regarding minimum, maximum and mean start time values for each named test suite. In addition to the statistical reporting of values and test times, the MVM module 412 may also write raw value log files every 30 seconds. These files can provide the ability to display value and test time wafer maps live while a wafer is being tested.

Exemplary MVM module 412 embodiments may be queried live for SPC rule evaluations. The MVM module 412 may also periodically write raw or statistic wafer (e.g. device under test) files which may be used by a web server 902 to display a summary screen, such as a wafer map, with the wafer map providing a map of test results for a semiconductor wafer, etc. An exemplary state machine module 406 may also initialize the MVM module 412 with tests that should be monitored and the SPC module 408 can make queries as needed to evaluate SPC rules.

Figure 10:
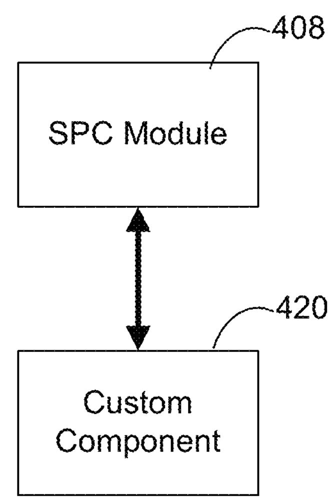
FIG. 10 illustrates an exemplary custom component to be added to a statistical analysis and control architecture in accordance with an embodiment of the present invention.
Figure 11:
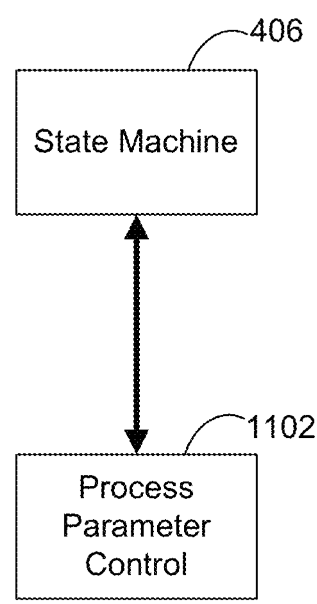
FIG. 11 illustrates an exemplary process parameter control component of a statistical analysis and control apparatus in accordance with an embodiment of the present invention.

In one exemplary embodiment, all MVM data may be kept in memory, such as a database server 416. Such memory storage may provide fast query times and improve processing times when processing large groups of data for statistical reporting. In one exemplary embodiment, any data that needs to be saved can be automatically written to an XML file during wafer testing or at the end of a wafer or lot. In one exemplary embodiment, as illustrated in FIG. 9, an MVM module 412 may also be supported with a local MVM client graphical user interface (GUI) 904 which allows direct queries and a display of MVM data in the form of charts, histograms and wafer maps. The local MVM client GUI 904 may also be used while the statistical analysis and process control framework 400 is running Statistical Process Control Customization:

A flexible component framework enables customization of SPC rules by allowing the creation of additional rules as well as further editing and modifying existing SPC rules. Such editing and creation of SPC rules with a web-based SPC rules editor is also described in detail herein. Custom components 420, as illustrated in FIGS. 4 and 10, may integrate seamlessly with standard components by sharing the same test cell communications framework for the sending and receiving of event notifications and commands. Custom components will therefore be able to communicate with other modules and receive test cell events so that the custom components may synchronize with test cell activities. An example of a custom module is an exemplary process parameter control (PPC) module 1102. As illustrated in FIG. 11, and discussed herein, the PPC module 1102 may be called by a state machine module 406 during a lot start.

Process Parameter Control Module:

As illustrated in FIG. 11, an exemplary process parameter control (PPC) module 1102 can keep track of critical parameters than may be used while running a test program 103. These parameters may include a test program name, a probe card ID, a prober firmware revision, a prober driver configuration, and a quantity of touchdowns for a particular probe card. A PPC module 1102 may check critical parameters that are found to be responsible for low yield or poor throughput of lot executions. By making sure the parameters are correct, the statistical analysis and process control framework 400 may avoid wasted test time that may result from mistakes in a test setup. Statistical analysis and process control framework embodiments 400 that include PPC modules 1102 may provide one way to improve yield by making sure that all setup parameters are correct. Many low yielding lots can be found to be caused by simple problems, such as: a worn probe card (e.g. touchdowns), an incorrect test program, wrong handling equipment, or a wrong firmware. By checking these parameters at lot start, the statistical analysis and process control framework 400 may therefore avoid costly testing mistakes.

Statistical process control methods as described herein may provide an effective way to identify testing process problems early before they can impact test cell throughput. The modular framework described herein may address the challenges associated with implementing SPC rules at wafer sort or final test on the test cell controller 102. A modular approach allows a high level of flexibility in factor integration and customization with the capability to work with existing test cells. An exemplary embodiment of a statistical analysis and process control framework 400 may effectively monitor and control production testing and also provide tools like the MVM module 412 for characterizing new devices-under-test during the ramp up phase of such a device.

The SPC rules can provide real-time control in an automated test equipment environment. The SPC rules can provide self-correction of equipment to an optimal level. For example, while test results may be passing a pass/fail criteria, under SPC rules a detected downward trend in quality that has not yet reached a failing level can be corrected to reach a desired optimal level.

The exemplary statistical process control methods, described herein, may therefore be used to go beyond simple pass/fail testing. The statistical analysis and process control framework 400 provides a way to measure quantitatively how far from normal process parameters are running. With pass or fail testing, only simple black and white answers can be provided, but with the above described statistical process control methods, a gray scale of answers to what is actually happening may be provided. Exemplary statistical analysis and process control framework 400 embodiments provide the necessary modules to implement the above described statistical process control methods, and do so in a way that induces negligible overhead. Further, exemplary real-time statistical process control and actions may be implemented without changing an application model or writing custom prober or handler drivers or hook functions.

Exemplary statistical analysis and process control framework modules such as the MVM module 412, the bin control module 410, and the prober/handler supervisor 414 can also be used during engineering characterization to examine critical values, monitor bin results, and use the prober 108 in an interactive mode, respectively. As discussed herein, statistical analysis and process control framework 400 embodiments may also provide graphical user interfaces for accessing the modules, for interactively accessing and customizing process control rules (and their parameters), as well as for interactively querying results while a wafer or other device under test is still running Algorithm and Structure Describing Test Cell Control:

An algorithm and structure is provided to create and define SPC rules (control rules and actions) used in the creation of a decision tree. In one exemplary embodiment, a plurality of SPC rules may be combined into a decision tree, with an algorithm created and/or followed that may determine when SPC rules are verified and an order of executing actions in response to SPC rule failures, such that more critical or priority SPC rule failures/violations are acted on first. In one exemplary embodiment, a decision tree may comprise a plurality of SPC rules that may be executed in a compound fashion that may best describe a modeling process for production troubleshooting. For example, multiple SPC rules may be executed together such that a consecutive bin failure SPC rule may be combined with a needle cleaning followed by a retest of a previously known good die.

In one exemplary embodiment, SPC rule definitions may be centrally stored and managed in a database 416 to serve multiple purposes. For example, SPC rules may be executed in either a long loop format or a short loop format. In one exemplary long loop format, historical analysis of SPC rule executions may be used to define an optimal set of SPC rules for run time (as well as an optimal order for the selected set of SPC rules, as well as optimal combinations of SPC rules). In one exemplary embodiment, the historical analysis may accurately describe the run-time environment for purposes of simulation. Further, the historical analysis may include the calculation of predictive figures of merit related to run-time execution on live equipment. In one exemplary embodiment, SPC rules may be executed on historical data as if the data was live. Based on these simulated results, the SPC rules may be optimally refined so that improved SPC rules may be executed in production testing.

In one exemplary embodiment, a structure may be used to define and describe SPC rules. Data source (parameters) may be defined as monitor inputs for a particular SPC rule. Rules (statistics and functions) may then be defined that use the monitor inputs. Actions and events may be defined that are asserted based on rule outcomes. In one exemplary embodiment, the structure may be flexible to define a many-to-many relationship of source to rules to actions. In one exemplary embodiment, a decision tree may comprise a plurality of SPC rules that may be loaded in optimal combinations and executed in optimal sequences at run time. In one exemplary embodiment, an SPC rule structure may be used to provide for an automatic action and recovery of equipment to operational health when SPC rule violations are detected, through the use of optimally combined SPC rules and actions that may be used to attempt to return the equipment to operational health.

In one exemplary embodiment, the SPC rules structure may be executed at run-time. Such a structure when executed at run-time may define a severity of any SPC rule violation, as well as determined control priorities in response to any SPC rule violation. Lastly, the SPC rules structure may avoid conflicts with other controlling entities. For example, while an SPC rule may assert the execution of an equipment maintenance action, if the test cell has just performed the requested maintenance event on an automatic schedule, the requested action would not be performed (as it was already performed on the automatic schedule).

In one exemplary embodiment, statistical process control rules may also be used to dynamically adjust the scheduling of commands to the prober 108 and handler 110 of the handling equipment 106. For example, the scheduling of prober needle cleaning can be adjusted dynamically, rather than the needle cleaning being performed in a fixed fashion (e.g., the needles are clean after every 50 dies, etc.). Such a static schedule may not be optimum. If the needles are cleaned too often, they will wear out prematurely, but if they aren't cleaned frequently enough, foreign matter may collect on the needles. Using statistical analysis and process control management, needle cleaning can be performed in an optimal manner, rather than following a rigid schedule. In a similar manner, when event notifications are received by a state machine module 406, such as an end of test notice, the state machine module 406 may determine that it is currently an appropriate time for SPC rule verification. The state machine module 406 may therefore send an SPC rule trigger to the SPC module 408 and in consequence, the SPC module 408 will begin executing SPC rules (singly or in combination) that are selected for verification as determined by an analysis of the event notifications received by the SPC module 408.

Figure 12:
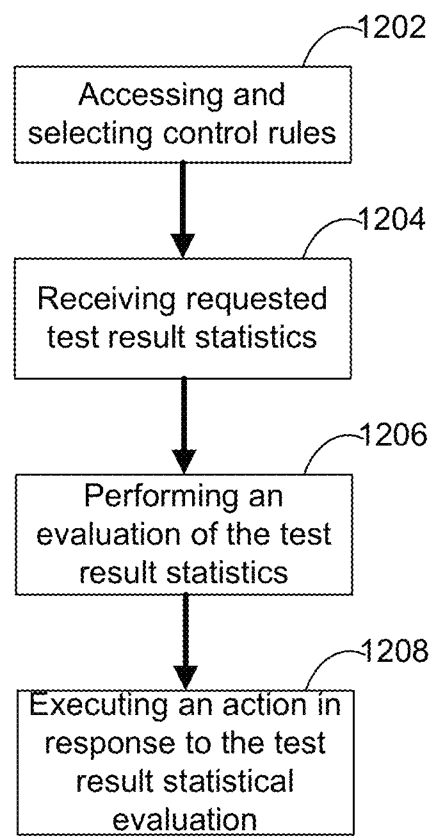
FIG. 12 illustrates an exemplary flow diagram, illustrating the steps to a method for real time process control analysis and action in accordance with an embodiment of the present invention.

FIG. 12 illustrates the steps to a process for selecting and arranging SPC rules into a decision tree, executing the SPC rules (singly and in combinations) in the decision tree and executing actions in response to SPC rule failures. In step 1202 of FIG. 12, a repository of SPC rules is accessed and a plurality of SPC rules is selected. The selected SPC rules may be arranged into a decision tree. Once arranged into a decision tree, the selected SPC rules may be executed as determined by a decision tree arrangement as well as an analysis of received event notifications (e.g., SPC rules selected for verification (singly or in combinations) may be selected based upon test cell events and executed in an optimal order, and any required actions may be executed in an order determined by each SPC rule failure's priority).

In step 1204 of FIG. 12, requested statistical analyses of test results are received. Each SPC rule may select one or more statistical analyses of test results. The requested statistical analyses will be evaluated for corresponding SPC rule verification. As described herein, SPC rules (singly or in combination) will not be verified until defined test progress interval limits have been reached as determined by the test results and received event notifications.

In step 1206 of FIG. 12, the SPC rules perform their defined evaluations of the received one or more statistical analyses of test results. The statistical tests as performed by, for example, a measured value monitor 412, may be defined and/or edited for a desired statistical test. The statistical tests are also performed for SPC rule verification upon reaching corresponding interval thresholds and/or event notifications. As described herein, the statistical tests performed may be for a defined combination of SPC rules.

In step 1208 of FIG. 12, the SPC rules may select an action to be executed in response to an evaluation of the one or more associated statistical analyses. For example, as discussed herein, if an SPC rule verification fails, an associated action may be performed. In one exemplary embodiment, when a plurality of SPC rules fail, an SPC rule with the highest priority may have its action executed first.

Figure 13:
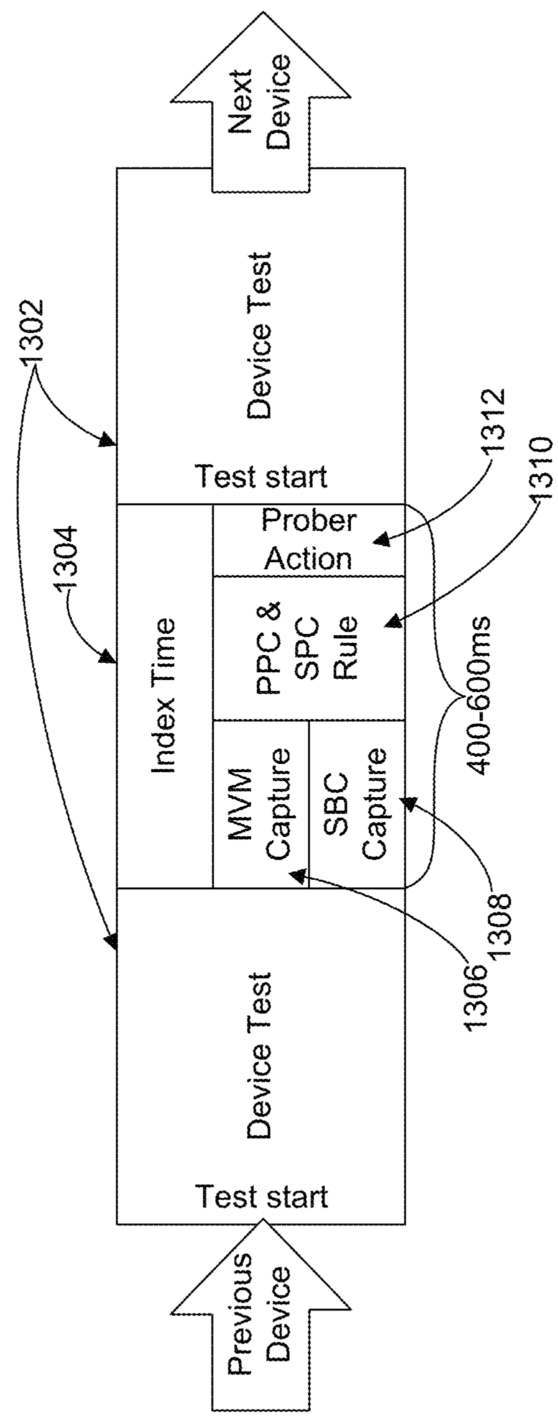
FIG. 13 illustrates an exemplary flow diagram, illustrating the steps to a method for creating and executing a decision tree during periods of test inactivity in accordance with an embodiment of the present invention.

Creation & Scheduling of a Decision Tree for a Test Cell Controller:

As illustrated in FIG. 13, in one exemplary embodiment of a test cell controller102, a decision tree for SPC rule execution may be created, scheduled, and executed. In one exemplary embodiment, a reduction in latency may be provided by synchronizing SPC rule executions and actions in synchronization with the operations of the prober 108 or hander 110 of the handling equipment 106. As illustrated in FIG. 13, in one exemplary embodiment, in-between the execution of tests 1302 on devices, periods of testing inactivity, such as prober and handling equipment indexing times 1304 may be identified. In one exemplary embodiment, an indexing time lasts 400-600 ms. It is during these periods of testing inactivity (e.g. indexing time) 1304 that the creation, scheduling and/or execution of a decision tree comprised of SPC rules may be accomplished. As illustrated in FIG. 13, MVM capture 1306, SBC capture 1308, PPC and SPC rule execution 1310 and subsequent SPC rule-initiated actions (e.g. prober 108 and handler 110 actions) 1312 may be performed during testing inactivity times (e.g. indexing time) 1304.

As discussed herein, an exemplary "index time" is a total time between the end of a last test flow and the beginning of a new test flow execution. This time may include many different operations such as device switch out, binning, etc. In one exemplary embodiment, from one device to another, the indexing time at wafer sort is the time it takes to position the probe 108 from one XY location on a wafer to another XY location on the wafer and to inform the test controller to get ready for the next test execution. At a final test, the indexing time is the time the handler 110 will need to take to remove the package from the socket, bin it into a good/bad tray and insert another package into the socket and inform the tester that the package is ready for testing.

In one exemplary embodiment, computational windows of opportunity may be identified to reduce SPC rule execution latency, such that the decision tree may be executed with low latency and near zero overhead or test time impact to a continuous testing process. For example, the execution of the SPC rules in the decision tree can be executed during idle periods of the current testing process. For example, as illustrated in FIG. 13, the SPC rules may be executed during prober and handling equipment indexing times. The SPC rules may be verified during periods of low test activity, such that the analysis of test results (e.g. periods of result computation) may be conducted while periods of test monitoring (e.g. periods of test computation) are not being conducted. A computation window may be identified and defined, such that a time when the computation window opens and closes may be identified. The definition of the computational window (e.g., its start and stop times) may be used to stop, delay or synchronize the creation and execution of a decision tree.

In one exemplary embodiment, a definition of a computational window includes event scheduling. Event scheduling may include communications with material handling equipment 106 to collect event information as to where other materials are positionally located to determine a window of availability for the synchronized decision tree creation and execution. In one exemplary embodiment, stepping event variability may be determined to predictably determine the window of opportunity (e.g., variability in stepping of X-axis versus Y-axis at wafer sort, and end of wafer, etc.).

The creation and execution of a decision tree during identified computational windows may improve the ability of exemplary statistical analysis process control framework embodiments to provide an adaptive test program environment. The test program environment may perform process drift detection and prevention to alert, stop, or automatically take action on a product stream to avoid the creation of a "bad" product. In one exemplary embodiment, maintenance automation, such as diagnostic procedures may be executed in computational windows within a running production process which may improve the outcome of maintenance and repair processes.

In one exemplary embodiment, the creation and execution of a decision tree may be concurrent with other processing within the test cell. For example, the computational window can be concurrent with any prober/handler supervisor 414 initiated holds as discussed above.

Figure 14:
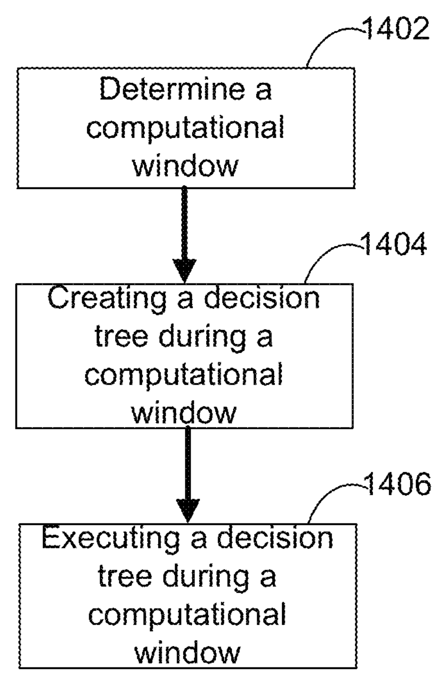
FIG. 14 illustrates an exemplary flow diagram, illustrating the steps to a method for creating and executing a decision tree during periods of test inactivity in accordance with an embodiment of the present invention.

FIG. 14 illustrates the steps to a process for creating and executing a decision tree in an identified computational window of increased computational capacity. In step 1402 of FIG. 14, a computational window is determined. In one exemplary embodiment, a computational window is a period of time with increased computational capacity. As discussed herein, a period of increased computational capacity may coincide with periods of testing inactivity, such as prober/handling equipment indexing times, or in other periods of reduced testing activity, as discussed herein. In one exemplary embodiment, a computational window is identified based upon projected or forecasted testing activities.

In step 1404 of FIG. 14, a decision tree is created during an identified computational window of increased computational capacity. In one embodiment, a period of increased computational capacity coincides with decreased testing activities.

In step 1406 of FIG. 14, a decision tree is executed during an identified computational window of increased computational capacity, which coincides with a period of decreased testing activities. In one embodiment, the execution of the decision tree may take place in a different computational window from the computational window when the decision tree was created. In one exemplary embodiment, the execution of a decision tree comprises at least one of test data acquisition, test data statistical analysis, and execution of actions in response to statistical analysis of the test data.

PH Supervisor Module & Proxy PH Driver: An Interposer for Injecting Control or Data Collection without Disrupting Test Cell Operation:

As illustrated in FIG. 15, the prober/handler supervisor 414 may be used as an interposer to inject actions or data collection into a test cell operation. As described herein, in one exemplary embodiment, a prober or handler command may be injected into a production process, with the command injected seamlessly and without disrupting the test cell. As illustrated in FIG. 15, a test program 103 sends function calls and receives responses in return from a proxy prober/handler driver 1502. Upon receiving a function call, the function call can be forwarded on from the proxy PH driver 1502 to the prober/handler supervisor 414 where control commands and other status request communications may be communicated to the prober 108 or handler 110 of the material handling equipment 106 via a custom or standard PH driver library 1504. In one embodiment, the control commands and status request communications are GPIB commands. In one exemplary embodiment, the control commands and status request communications may be transmitted via a buss, such as GPIB, RS-232, and LAN, etc.

As illustrated in FIG. 15, a test execution server 1506 may be interposed between the state machine 406 and test cell APIs 1508. In one exemplary embodiment, a state machine 406 may access test cell APIs 1508 through the test execution server 1506. As also illustrated in FIG. 15, alarms and events are passed through the test execution server 1506 from to the state machine 406. In other words, the test execution server 1506 may be used to isolate the test cell APIs 1508 from direct access from modules of the test cell. In one exemplary embodiment, the test execution server 1506 serves as an interface between the state machine and the test cell APIs 1508. Alarms and events may be received by the test execution server 1506, which in turn dispatches them to the state machine 406 and other modules in the test cell architecture.

In one embodiment without an ability to interpose commands, an application model of a test program 103 calls a library driver that communicates directly with the material handling equipment 106 (e.g., a prober 108 or handler 110). Therefore, in exemplary embodiments, a proxy library 1502 is installed where the application model of the test program 103 will be looking for the driver library. In one embodiment, the proxy library 1502 may look like a traditional library to the application model of the test program 103. As described herein, the proxy library 1502 may forward commands from the application model to the prober/handler supervisor 414 using the test cell communications framework, which in turn may execute the received command with the custom or standard PH library 1504.

As illustrated in FIG. 15, additional prober or handler commands may be initiated by modules of the statistical analysis and process framework 400 (rather than just the test program 103). In one embodiment, the additional prober or handler commands are initiated by the state machine module 406. As discussed herein, such additional prober or handler commands may be SPC rule-initiated actions in response to a detected SPC rule violation or failure. As described herein, an SPC rule-initiated action, such as a z-height adjustment or needle cleaning, may be transparently interposed into the test operation. In one exemplary embodiment, when an SPC rule-initiated action needs to be implemented at a prescribed time (e.g., during handler operations to retrieve a next unit for test), the PH supervisor 414 may insert a hold into test cell operations until such a time that the SPC requested action is completed. Such a hold will prevent any further function calls from the test program 103 from being communicated to the material handling equipment 106 (e.g., the prober 108 and/or handler 110). In one exemplary embodiment, a test cell may issue a periodic command to clean the needles or perform other handling equipment functions, so interposed commands as described herein may be scheduled around and/or take the scheduling of commands into account, such that an SPC rule initiated action will not duplicate a scheduled test cell-initiated command.

As illustrated in FIG. 15, an exemplary PH Supervisor 414 may synchronize the state machine 406 with the execution of the test program 103 by synchronizing with the execution of prober or handler equipment driver calls from the application model. The state machine module 406 and the test program 103 may be synchronized by holding a test program-initiated PH call so that the state machine 406 can perform SPC rule-initiated actions and have access to the PH driver library in the PH supervisor 414 as needed. The PH Supervisor 414 may allow SPC rule-initiated actions to perform z-height adjustment, needle cleaning, and status query and control. In one exemplary embodiment, the PH Supervisor 414 may synchronize the state machine 406 with the execution of the test program 103 by synchronizing with the execution of prober or handler equipment driver calls from the application model of the test program 103. This synchronization may allow the state machine 406 to perform SPC rule checks and SPC rule-initiated actions during a prober/handler index times (e.g. periods of test inactivity while the handling equipment 106 is preparing for a next test flow by repositioning a prober 108 at wafer sort or by retrieving a next device for test at final test, etc.).

In one exemplary embodiment, an exemplary PH Supervisor 414 can perform the functions listed in table 9.

TABLE 9

| |
|---|
| Execution hold at lot, wafer, die, and pause actions. |
| a. These holds may be synchronized with a normal test cell idle time so that the holds don't impact throughput of the test cell. |
| b. These holds may allow a statistical analysis and process control framework to perform its SPC functions at the lot, wafer, and die levels. |
| Execution of commands to control the prober or handler during a hold period which can be used to gather status or to perform special operations such as auto z-height adjustments. |
| Loading PH driver shared libraries during lot start. Normal test cell controller operation loads a fixed PH driver shared library. The PH Supervisor 414 may change libraries and report which library is loaded. A command can also be provided to select the driver configuration file at a later date. |

As illustrated in FIG. 15, the test program application model may call the Proxy PH driver 1502 functions in the same manner as it would call normal PH driver functions. In other words, the test program application model is not aware that its commands are received by a proxy PH driver 1502 and passed on to the PH driver library 1504 instead of being received directly by the PH driver library 1504. The proxy PH driver 1502 may pass the request for a function execution to the PH Supervisor 414 using an IPC message queue. In most cases, the PH Supervisor 414 may execute the matching call within the custom or standard PH driver library 1504. In one exemplary embodiment, the Proxy PH driver library 1502 is loaded by the application model and has a superset of all function calls for both handler and prober drivers.

In one exemplary embodiment, the operation of the PH Supervisor 414 will not add overhead to the execution of the test cell. For this reason, a hold on PH calls (from the test program) may occur during testing pauses, such as a prober or handling equipment indexing time (e.g. periods of test inactivity while the handling equipment 106 is preparing for a next test flow by repositioning a prober 108 at wafer sort, or by retrieving a next device for test at final test, etc.). In one exemplary embodiment, the PH driver call that loads the next package or die may be placed on hold. In one embodiment, the overhead of the PH supervisor 414 is extremely small, such as on the order of 200 μsecs per call.

A decision to make a physical action (e.g., needle cleaning, etc.) needs to be executed at an optimal time. As described herein, the normal test process may be temporarily placed on hold so that a requested physical action will bring the production system into an optimal level of performance. While an exemplary intrusion (e.g., interposed physical action) may potentially slow down the testing, correcting the process or the prevention of improper testing or additional unnecessary testing of bad components will improve later testing. As described herein, one purpose of exemplary embodiments is to optimize production by customizing SPC rules, building decision trees, and executing the decision trees at desired periods of low test activity as well as transparently interposing prober and handler commands without the programming model becoming aware of the hold on its equipment handler commands.

Figure 16:
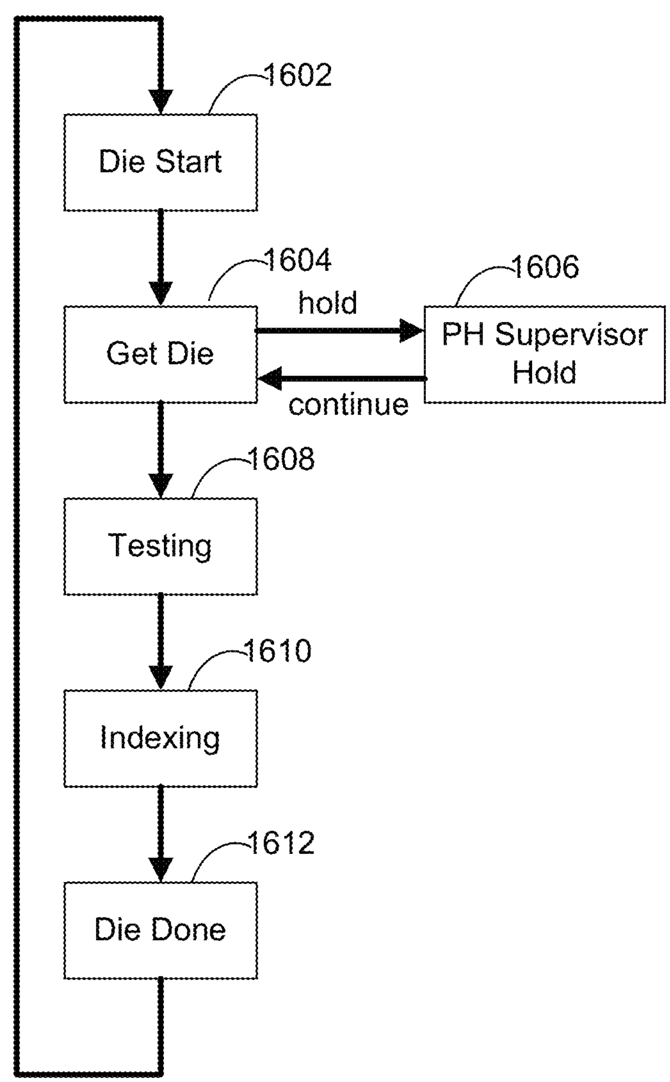
FIG. 16 illustrates an exemplary flow diagram, illustrating the steps to a method for real-time test analysis and action execution during a continuing automated test in accordance with an embodiment of the present invention.

FIG. 16 illustrates an exemplary flow diagram of a test flow executed by an ATE test cell. In step 1602 of FIG. 16, a device test is initiated. In step 1604 of FIG. 16, a command to get the next die for testing is executed. As discussed herein, the request is communicated to the PH supervisor 414 and at this time, as illustrated in step 1606 of FIG. 16, the prober or handler command may be placed on hold while an SPC rule-initiated action is carried out. Upon completion of the SPC rule-initiated action, the hold may be released by the PH supervisor 414 and the PH command will be forwarded and the next requested die retrieved. As illustrated in FIG. 16, the test flow returns from step 1606 back to step 1604. Upon returning to step 1604 of FIG. 16, and upon completion of the get die command, the testing process will continue with step 1608 of FIG. 16 and testing will commence on the newly placed die. In step 1610 of FIG. 16, a prober 108 and handler 110 of the handling equipment 106 will enter an indexing time. As discussed herein, such an indexing time may also be used to perform SPC rule processing, as the testing activity is diminished during the indexing, with a corresponding increase in available computational capacity. In step 1612 of FIG. 16, the testing on the current die is completed and a test finished command is initiated and the current die is swapped out for the next die to be tested and the process returned to step 1602.

Figure 17:
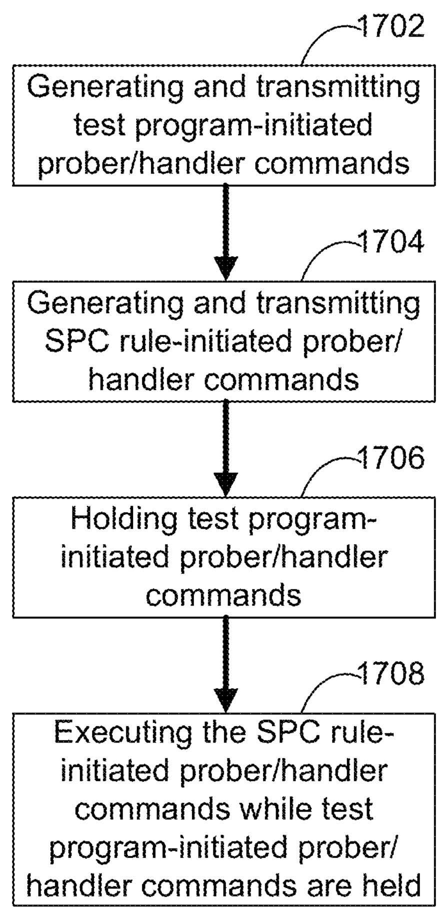
FIG. 17 illustrates an exemplary flow diagram, illustrating the steps to a method for interposing prober or handler commands that are transparent to a test program executing an on-going test.

FIG. 17 illustrates a process for transparently interposing SPC rule-initiated prober or handler commands in between test program-initiated prober or handler commands. In step 1702 of FIG. 17, a test program-initiated prober or handler command is generated and transmitted to a PH supervisor 414.

In step 1704 of FIG. 17, an SPC rule-initiated prober or handler command is generated and transmitted to the PH supervisor 414. In one exemplary embodiment, the SPC rule-initiated prober or handler command may be generated and transmitted in response to a process control rule failure (e.g. an "additional" prober or handler command).

In step 1706 of FIG. 17, in anticipation of the execution of the SPC rule-initiated prober or handler commands, the test program-initiated prober or handler commands are placed on hold by the PH supervisor 414. In one exemplary embodiment, the placing of the hold by the PH supervisor 414 is by direction of the state machine module 406. In step 1708 of FIG. 17, the SPC rule-initiated prober or handler command is executed. In one exemplary embodiment, the execution of the SPC rule-initiated prober or handler command and the placing of the test program-initiated prober or handler commands on hold is transparent to the test program 103.

Although certain preferred embodiments and methods have been disclosed herein, it will be apparent from the foregoing disclosure to those skilled in the art that variations and modifications of such embodiments and methods may be made without departing from the spirit and scope of the invention. It is intended that the invention shall be limited only to the extent required by the appended claims and the rules and principles of applicable law.

What is claimed is:

1. An apparatus for testing a device, the apparatus comprising:

a test control module operable to generate and transmit first prober and handler (PH) requests to a supervisor module, wherein the supervisor module is operable to transmit first PH commands to a prober and handler for execution thereof; and a test analysis module operable to generate and transmit second PH requests to the supervisor module, wherein the supervisor module is further operable to transmit second PH commands to the prober and handler for execution thereof, and wherein the execution of the second PH commands are performed transparently to the test control module, wherein the second PH commands comprise statistical process control (SPC) rule-initiated actions.

2. The apparatus of claim 1, wherein the test analysis module is further operable to perform test analyses of test results accessed by the test analysis module, and wherein the second PH requests are generated in response to the test analyses of the test results.

3. The apparatus of claim 1, wherein the test control module is further operable to generate test results responsive to testing of the device, and wherein the first PH requests are generated during testing of one or more devices.

4. The apparatus of claim 1, wherein the supervisor module is further operable to generate a hold on any received first PH requests while a second PH command is contemporaneously being executed by the prober and handler.

5. The apparatus of claim 4, wherein a hold on first PH requests comprises a hold on at least one of a new lot loading, a wafer switching, a die switching, XY location switching, and test control module initiated pause actions.

6. The apparatus of claim 1, wherein the first PH commands comprise at least one of prober and handler control commands and status queries.

7. The apparatus of claim 1, wherein the second PH commands comprise at least one of z-height adjustment commands, needle cleaning commands, status queries, and prober and handler control commands.

8. A method for testing a device, the method comprising:

generating and transmitting first prober and handler (PH) commands to a prober and handler for execution, wherein the first PH commands are generated in response to first PH requests from a test control module;

generating and transmitting second (PH) commands to the prober and handler for execution, wherein the second PH commands are generated in response to first PH requests from a test analysis module, and wherein the execution of the second PH commands is performed transparently to the test control module, wherein the second PH commands comprise statistical process control (SPC) rule-initiated actions.

9. The method of claim 8, wherein the execution of the second PH commands is performed transparently to the test control module by a supervisor module interposed between the test control module and the test analysis module and the prober and handler, and wherein the supervisor module transmits first and second PH commands in response to received first and second PH requests.

10. The method of claim 9 further comprising generating a hold on any first PH requests received by the PH supervisor while a second PH command is contemporaneously being executed by the prober and handler.

11. The method of claim 10, wherein a hold on first PH requests comprises a hold on at least one of a new lot loading, a wafer switching, a die switching, XY location switching, and test control module initiated pause actions.

12. The method of claim 8 further comprising performing test analyses of test results accessed by the test analysis module, wherein the second PH requests are generated in response to the test analyses of the test results.

13. The method of claim 8 further comprising:

generating test results during testing of a device, wherein the first PH requests are generated during testing of one or more devices.

14. The method of claim 8, wherein the first PH commands comprise at least one of prober and handler control commands and status queries.

15. The method of claim 8, wherein the second PH commands comprise at least one of z-height adjustment commands, needle cleaning commands, status queries, and prober and handler control commands.

16. A computer readable media comprising computer-executable instructions stored therein, the computer-executable instructions comprising a method comprising:

instructions to generate and transmit first prober and handler (PH) commands to a prober and handler for execution, wherein the first PH commands are generated in response to first PH requests from a test control module;

instructions to generate and transmit second (PH) commands to the prober and handler for execution, wherein the second PH commands are generated in response to first PH requests from a test analysis module, and wherein the execution of the second PH commands is performed transparently to the test control module, wherein the second PH commands comprise statistical process control (SPC) rule-initiated actions.

17. The computer readable media of claim 16, wherein the execution of the second PH commands is performed transparently to the test control module by a supervisor module interposed between the test control module and the test analysis module and the prober and handler, and wherein the supervisor module transmits first and second PH commands in response to received first and second PH requests.

18. The computer readable media of claim 17, wherein the method further comprises instructions to generate a hold on any first PH requests received by the PH supervisor while a second PH command is contemporaneously being executed by the prober and handler, wherein a hold on first PH requests comprises a hold on at least one of a new lot loading, a wafer switching, a die switching, XY location switching, and test control module initiated pause actions.

19. The computer readable media of claim 16, wherein the method further comprises:

instructions to perform test analyses of test results accessed by the test analysis module, wherein the second PH requests are generated in response to the test analyses of the test results; and instructions to generate test results during testing of a device, wherein the first PH requests are generated during testing of one or more devices.

20. The computer readable media of claim 16, wherein the first PH commands comprise at least one of prober and handler control commands and status queries, and wherein the second PH commands comprise at least one of z-height adjustment commands, needle cleaning commands, status queries, and prober and handler control commands.

* * * * *